US010304728B2

(12) United States Patent
Schultz

(10) Patent No.: US 10,304,728 B2
(45) Date of Patent: May 28, 2019

(54) DOUBLE SPACER IMMERSION LITHOGRAPHY TRIPLE PATTERNING FLOW AND METHOD

(71) Applicant: Advanced Micro Devices, Inc., Sunnyvale, CA (US)

(72) Inventor: Richard T. Schultz, Fort Collins, OH (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 15/608,749

(22) Filed: May 30, 2017

(65) Prior Publication Data

US 2018/0315645 A1 Nov. 1, 2018

Related U.S. Application Data

(60) Provisional application No. 62/492,692, filed on May 1, 2017.

(51) Int. Cl.

*H01L 21/768* (2006.01)
*H01L 23/528* (2006.01)
*H01L 23/522* (2006.01)

(52) U.S. Cl.

CPC .. *H01L 21/76816* (2013.01); *H01L 21/76877* (2013.01); *H01L 23/528* (2013.01); *H01L 23/5226* (2013.01)

(58) Field of Classification Search

CPC ........................ H01L 21/0338; H01L 21/3086
See application file for complete search history.

(56) References Cited

U.S. PATENT DOCUMENTS

| | | | |
|---|---|---|---|
| 6,156,600 | A | 12/2000 | Chao et al. |
| 9,425,318 | B1 | 8/2016 | Hoentschel et al. |
| 9,704,995 | B1 | 7/2017 | Schultz |
| 2001/0041402 | A1 | 11/2001 | Yamamoto |
| 2006/0216897 | A1 | 9/2006 | Lee et al. |

(Continued)

FOREIGN PATENT DOCUMENTS

WO 2014/051769 A1 4/2014

OTHER PUBLICATIONS

Schultz et al., U.S. Appl. No. 15/275,028, entitled "Power Grid Layout Designs for Integrated Circuits", filed Sep. 23, 2016, 36 pages.

(Continued)

*Primary Examiner* — Sitaramarao S Yechuri
(74) *Attorney, Agent, or Firm* — Meyertons Hood Kivlin Kowert and Goetzel PC; Rory D. Rankin

(57) ABSTRACT

A system and method for fabricating metal patterns are described. Multiple mandrels are formed on a first polysilicon layer which is on top of a first oxide layer. Each mandrel uses a second polysilicon on top of a first nitride. A spacer oxide and a spacer nitride are formed on the sidewalls of the mandrels to create double spacers. A second oxide layer is deposited followed by removing layers until the first nitride in the mandrels is reached. Areas are etched based on a selected method of multiple available methods until the first oxide layer is etched providing trenches for the metal patterns. Remaining materials on the first oxide layer are removed followed by metal being deposited in the trenches in the first oxide layer.

12 Claims, 16 Drawing Sheets

(56) References Cited

U.S. PATENT DOCUMENTS

| | | | |
|---|---|---|---|
| 2007/0157144 | A1 | 7/2007 | Mai et al. |
| 2007/0278528 | A1 | 12/2007 | Ato et al. |
| 2009/0187871 | A1 | 7/2009 | Cork |
| 2010/0148219 | A1 | 6/2010 | Shimizu |
| 2011/0151668 | A1* | 6/2011 | Tang .................. H01L 21/0337 438/671 |
| 2012/0007051 | A1 | 1/2012 | Bangsaruntip et al. |
| 2012/0138886 | A1 | 6/2012 | Kuhn et al. |
| 2013/0155753 | A1 | 6/2013 | Moon et al. |
| 2013/0161792 | A1 | 6/2013 | Tran et al. |
| 2014/0106474 | A1* | 4/2014 | Chen ...................... H01L 22/20 438/5 |
| 2014/0145342 | A1 | 5/2014 | Schultz et al. |
| 2014/0183643 | A1 | 7/2014 | Colinge et al. |
| 2014/0374879 | A1 | 12/2014 | Chen et al. |
| 2015/0061087 | A1* | 3/2015 | Hong ................... H01L 21/308 257/635 |
| 2015/0144880 | A1 | 5/2015 | Rachmady et al. |
| 2015/0243519 | A1* | 8/2015 | deVilliers ........... H01L 21/0337 438/692 |
| 2015/0295036 | A1 | 10/2015 | Hong |
| 2015/0372104 | A1 | 12/2015 | Liu et al. |

OTHER PUBLICATIONS

Schultz, Richard T., U.S. Appl. No. 15/421,157, entitled "Gate All Around Device Architecture With Hybrid Wafer Bond Technique", filed Jan. 31, 2017, 38 pages.

International Search Report and Written Opinion in International Application No. PCT/US2017/052339, dated Dec. 6, 2017, 15 pages.

Dargis et al., "Epitaxial Growth and Properties of Silicon on Crystalline Rare-Earth-Metal Oxide for SOI-Applications", Materials Science, May 1, 2009, pp. 11-15, vol. 15, No. 1.

Schultz, Richard T., U.S. Appl. No. 15/466,643, entitled "Oscillating Capacitor Architecture in Polysilicon for Improved Capacitance", filed Mar. 22, 2017, 34 pages.

Schultz, Richard T., U.S. Appl. No. 15/819,879, entitled "Metal Zero Power Ground Stub Route to Reduce Cell Area and Improve Cell Placement at the Chip Level", filed Nov. 21, 2017, 28 pages.

* cited by examiner

Method 1400

```
┌─────────────────────────────────────────────┐
│ Deposit a conformal spacer oxide layer over a│
│ polysilicon layer and mandrels on top of the │
│                polysilicon layer             │
│                     1402                     │
└─────────────────────────────────────────────┘
                       │
                       ▼
┌─────────────────────────────────────────────┐
│ Etch the conformal spacer oxide layer leaving│
│           sidewalls on the mandrels          │
│                     1404                     │
└─────────────────────────────────────────────┘
                       │
                       ▼
┌─────────────────────────────────────────────┐
│ Deposit a conformal spacer nitride layer over│
│  exposed areas of the polysilicon layer and  │
│                  the mandrels                │
│                     1406                     │
└─────────────────────────────────────────────┘
                       │
                       ▼
┌─────────────────────────────────────────────┐
│Etch the conformal spacer nitride layer leaving│
│ sidewalls on the mandrels to form a double   │
│ spacer with the remaining spacer oxide layer │
│                     1408                     │
└─────────────────────────────────────────────┘
                       │
                       ▼
┌─────────────────────────────────────────────┐
│  Deposit an oxide layer over exposed areas   │
│  of the polysilicon layer and the double     │
│                    spacer                    │
│                     1410                     │
└─────────────────────────────────────────────┘
                       │
                       ▼
┌─────────────────────────────────────────────┐
│Remove the top-most oxide layer, the double   │
│spacer and the mandrels until the nitride     │
│              layers are reached              │
│                     1412                     │
└─────────────────────────────────────────────┘
```

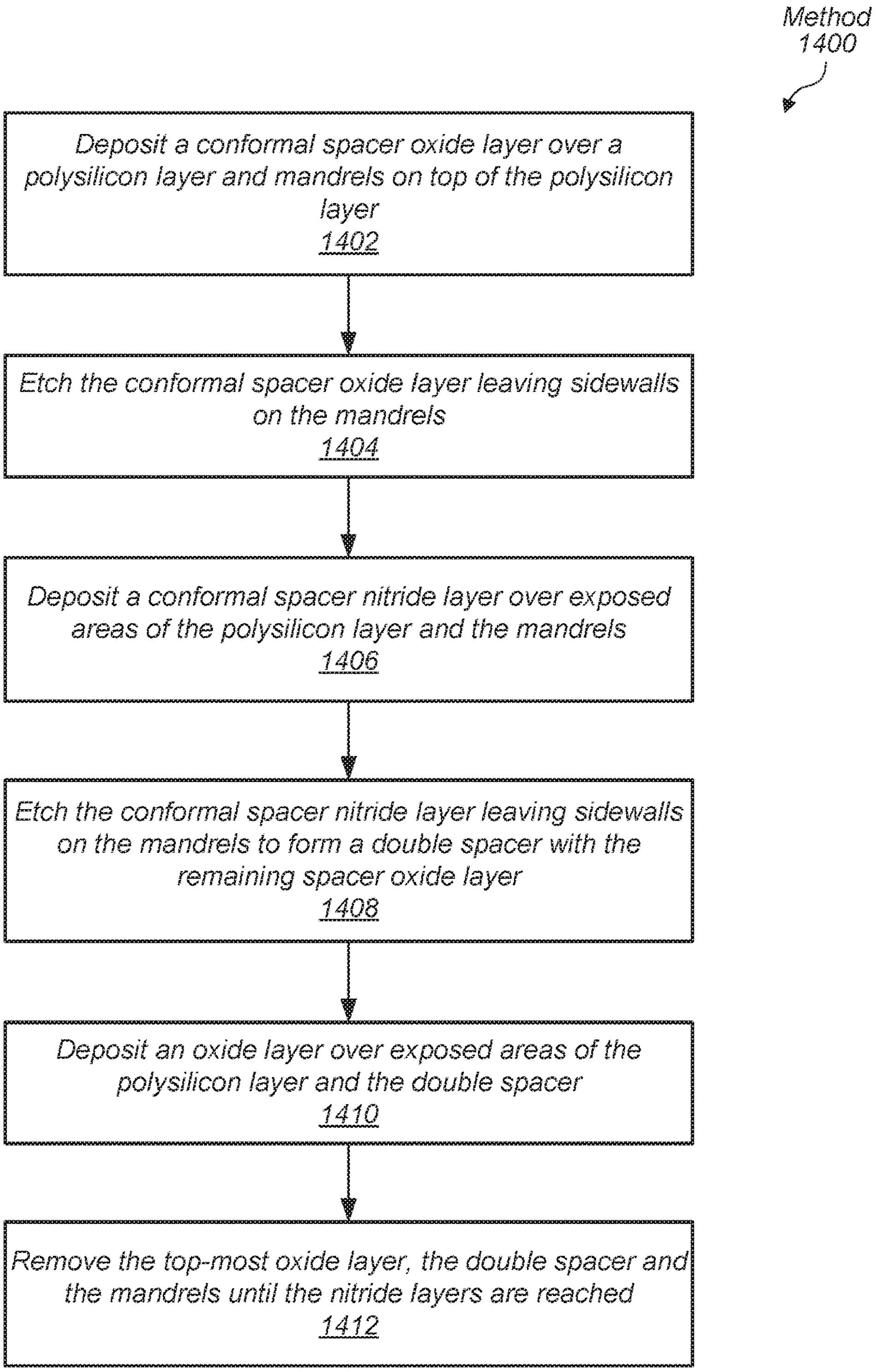

FIG. 14

Oxide Trench Etch

Polysilicon Etch

Metalization

Oxide, Poly Silicon, Nitride CMP

Oxide Etch and Polysilicon Etch

Nitride Strip

DOUBLE SPACER IMMERSION LITHOGRAPHY TRIPLE PATTERNING FLOW AND METHOD

CROSS REFERENCE TO RELATED APPLICATIONS

This application claims priority to Provisional Patent Application Ser. No. 62/492,692, entitled "Double Spacer Immersion Lithography Triple Patterning Flow And Method", filed May 1, 2017, the entirety of which is incorporated herein by reference.

BACKGROUND

Description of the Relevant Art

As both semiconductor manufacturing processes advance and on-die geometric dimensions reduce, semiconductor chips provide more functionality and performance while consuming less space. While many advances have been made, design issues still arise with modern techniques in processing and integrated circuit design that may limit potential benefits. For example, as the number and size of signal routes used in a design increase, the area consumed by the corresponding metal wires also increases. To achieve reductions in the width and pitch of metal wires, relatively expensive processing techniques are used. In addition, these relatively expensive processing techniques are also relatively new and accordingly have a relatively high defect rate.

In view of the above, efficient methods and systems for fabricating metal wires while managing semiconductor processing yield and decreasing signal congestion are desired.

BRIEF DESCRIPTION OF THE DRAWINGS

The advantages of the methods and mechanisms described herein may be better understood by referring to the following description in conjunction with the accompanying drawings, in which:

FIG. 14 is a generalized diagram of another method for fabricating metal patterns to be used for metal tracks.

Figure 1:
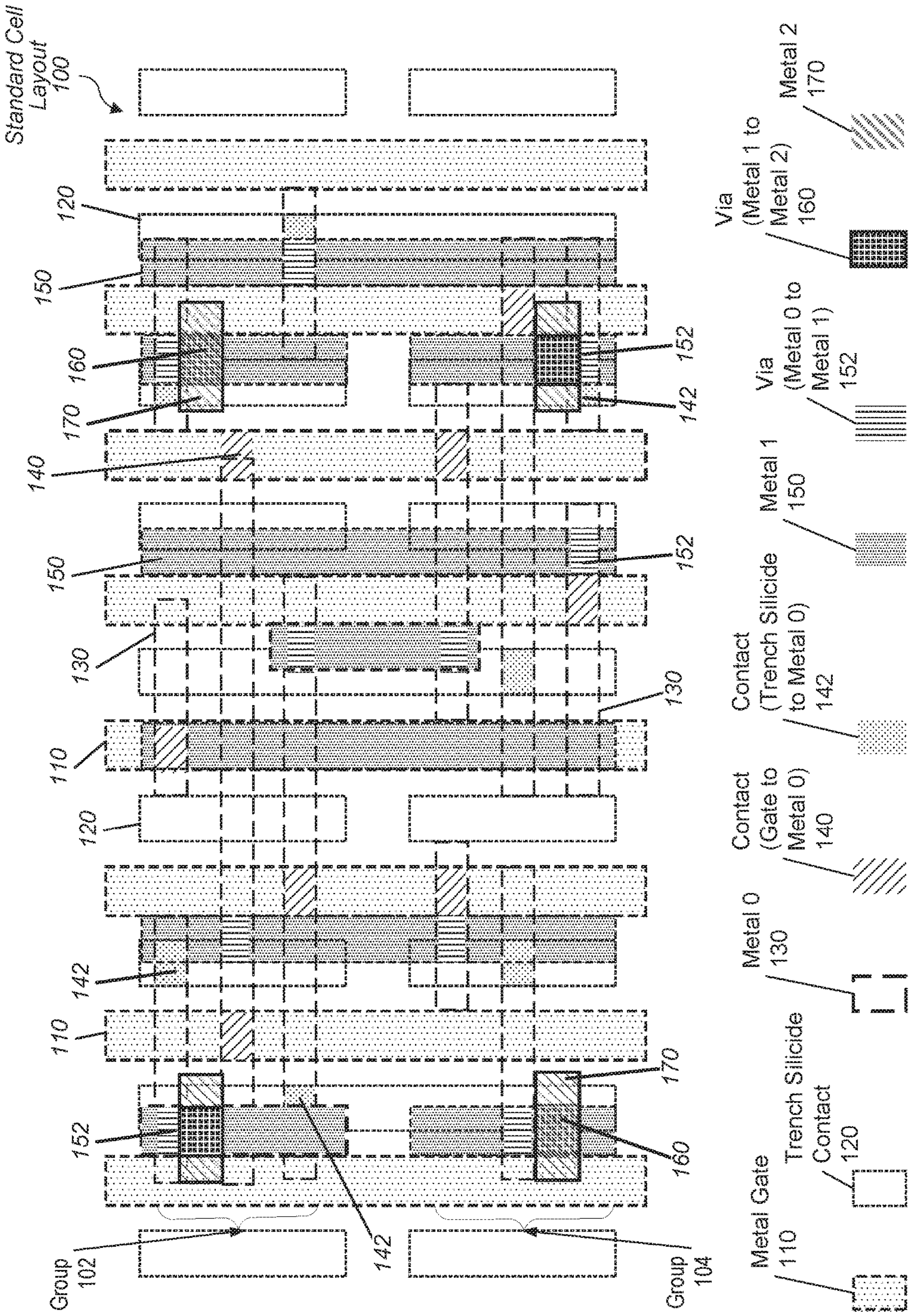
FIG. 1 is a generalized diagram of a top view of a standard cell layout.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

In various embodiments, a standard cell uses one or more groups of signal wires for signal routing. In some embodiments, the standard cell uses a first group at the top of the cell in for horizontal signal routes and a second group at the bottom of the cell for horizontal signal routes. Each group uses two or more metal tracks for the signal wires. In some embodiments, these metal tracks use a local interconnect metal layer such as metal 0. The width of the metal and the spacing between the metal is significantly small and created by a semiconductor fabrication process with a relatively high resolution. The high resolution allows for multiple contacts to be placed on trench silicide contacts and metal gates where they interconnect with either of the top group and the bottom group of metal tracks using the local interconnect.

The multiple locations provide efficient signal and power routing within the standard cell so the chance of using another metal layer other than the local interconnect is significantly reduced. For example, PMOS FETS (p-type metal oxide semiconductor field effect transistors, or pfets) at the top of the standard cell have access to multiple potential locations for contacts within the top group of metal tracks using the local interconnect. Similarly, the NMOS FETS (n-type metal oxide semiconductor field effect transistors, or nfets) at the bottom of the standard cell have access to multiple potential locations for contacts within the bottom group of metal tracks using the local interconnect. The flexibility offered by the multiple potential locations for contacts within these groups eliminates using other metal interconnects, such as Metal 1 or Metal 2, and the corresponding contacts for routing signals and power.

In order to create the groups of metal tracks using the local interconnect, a semiconductor structure is fabricated using a first polysilicon layer on top of a first oxide layer. Multiple mandrels are on top of the first polysilicon layer where each mandrel includes a second polysilicon on top of a first nitride. The semiconductor structure includes a first pair of sidewalls on each of the multiple mandrels, wherein each sidewall uses spacer oxide. A second pair of sidewalls is on each of the first pair of sidewalls, where each of these sidewalls use spacer nitride. Therefore, on each side of each mandrel is a double spacer using a combination of the spacer oxide and the spacer nitride.

Figure 2:
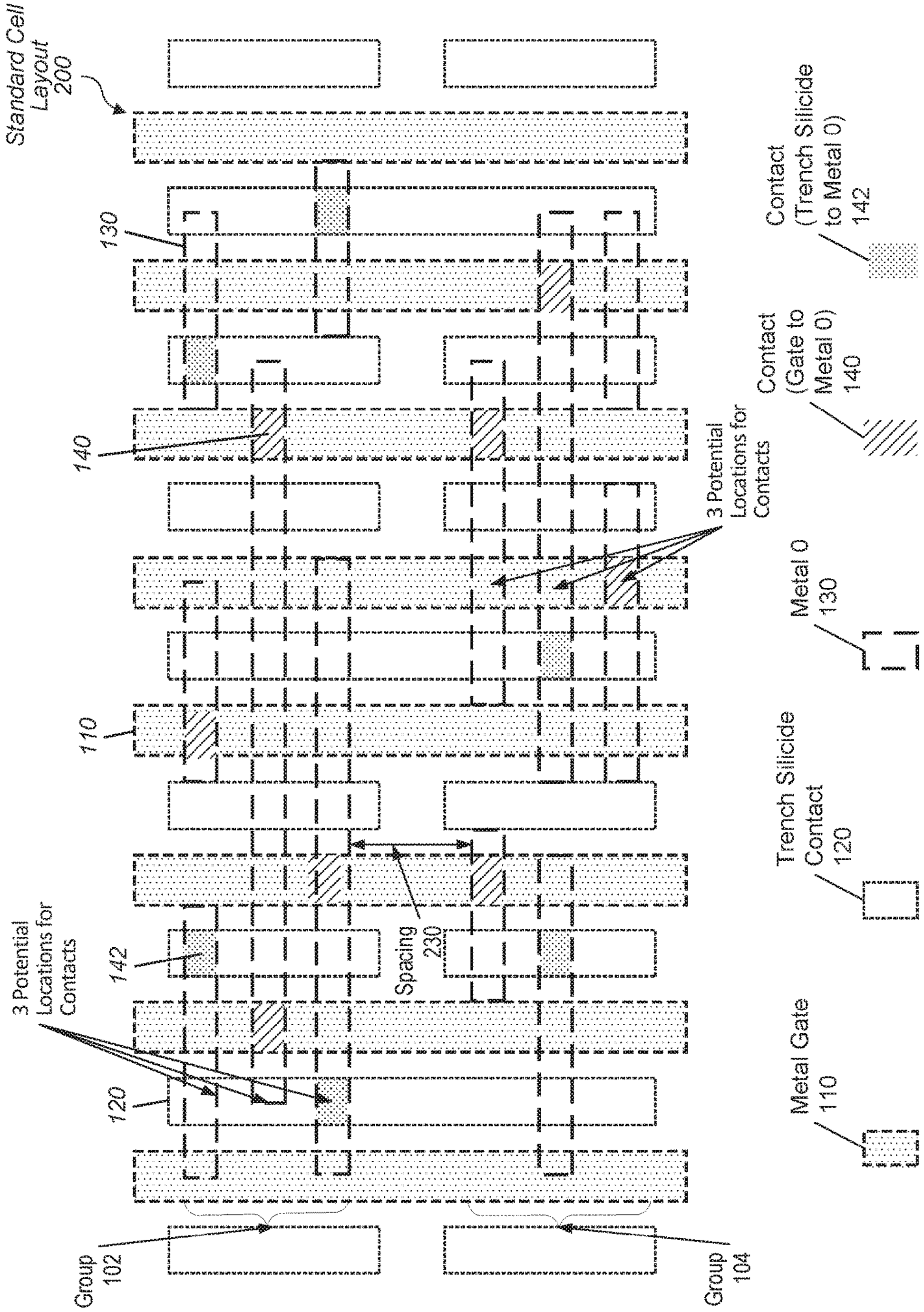
FIG. 2 is a generalized diagram of another top view of a standard cell layout highlighting the use of a group of signal tracks.
Figure 24:
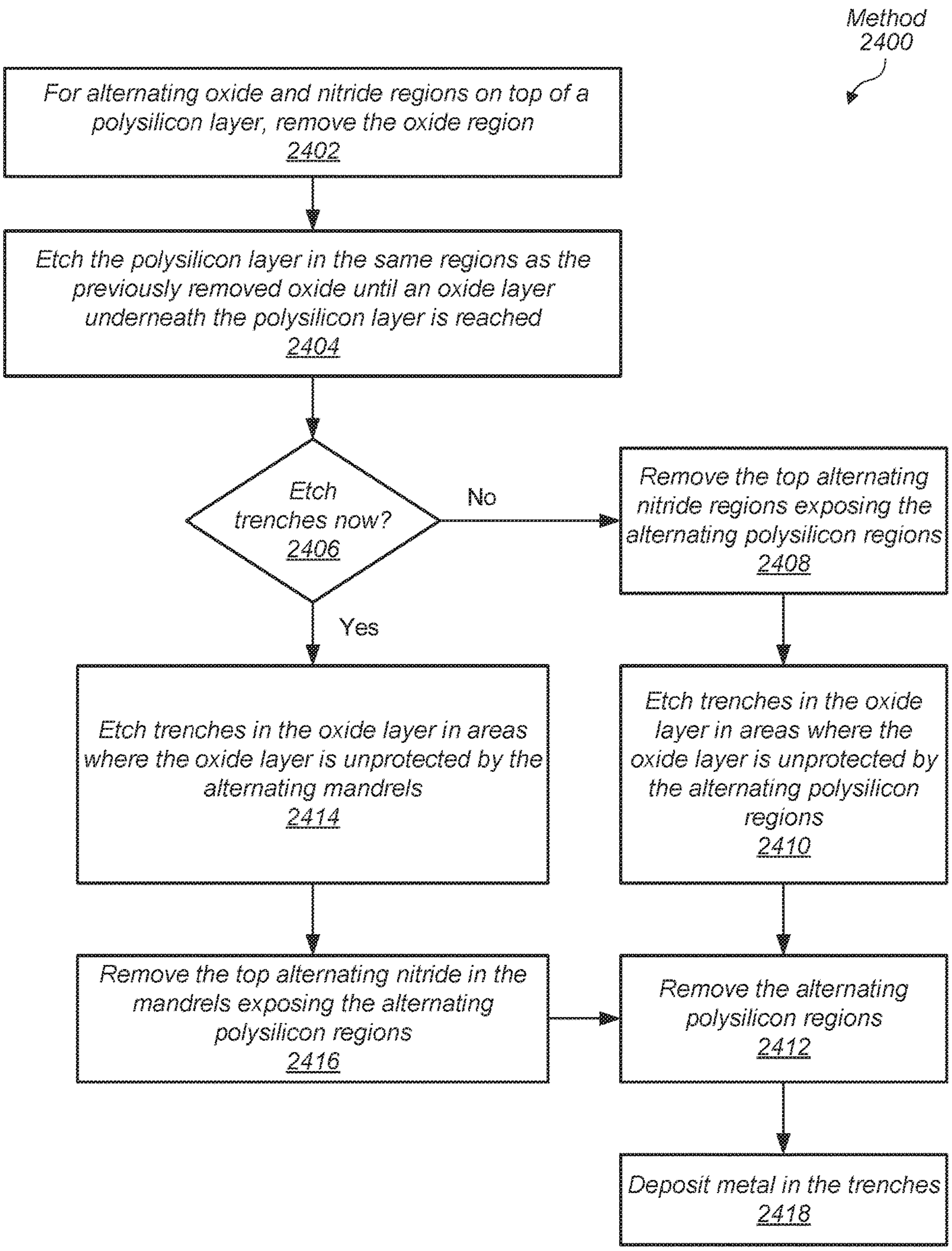
FIG. 24 is a generalized diagram of another method for fabricating metal patterns to be used for metal tracks.
Figure 34:
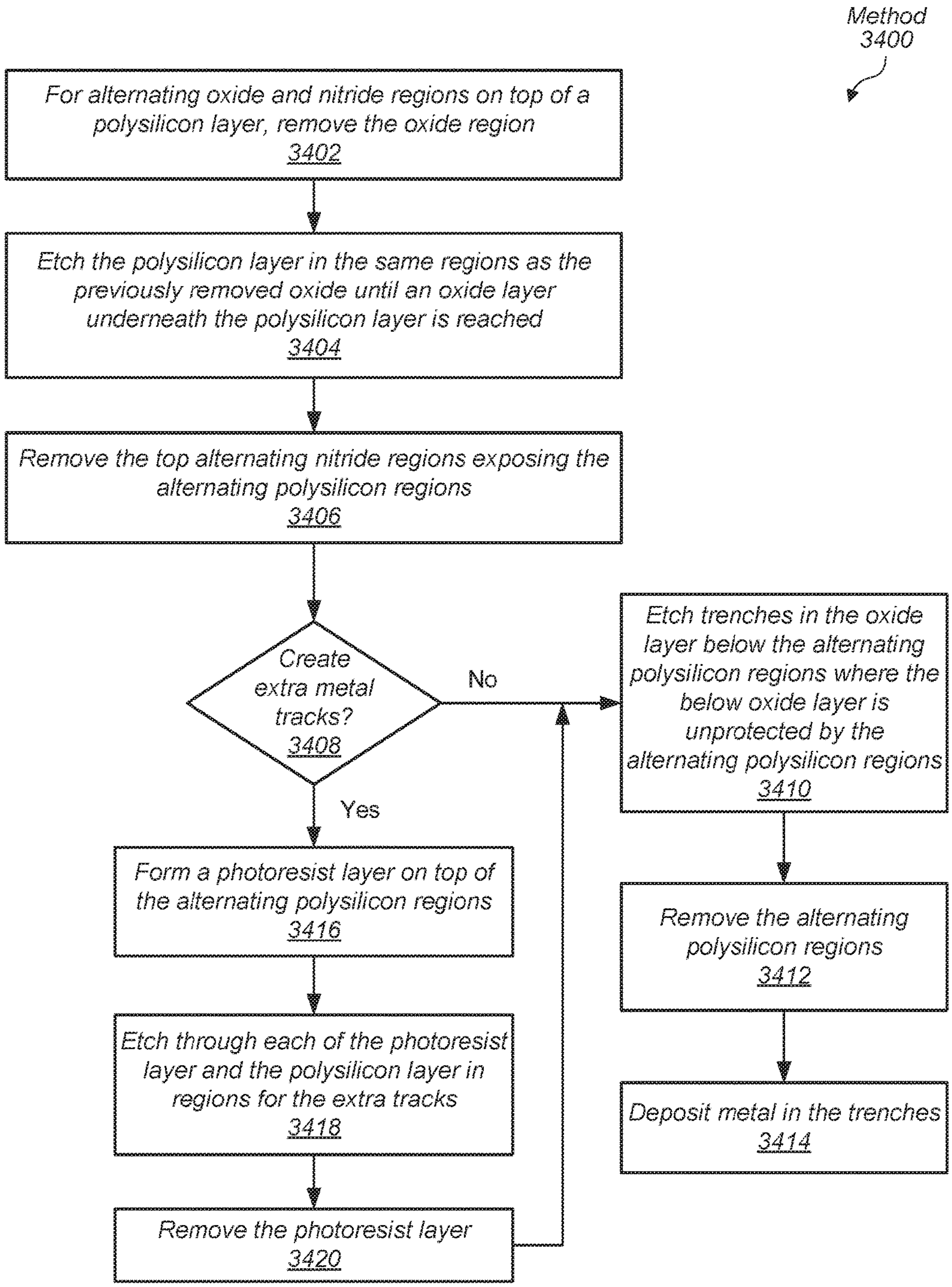
FIG. 34 is a generalized diagram of another method for fabricating metal patterns to be used for metal tracks.

A second oxide layer is deposited over the double spacers and exposed areas of the first polysilicon layer. At least one mandrel of the multiple mandrels has a width used for spacing between two groups of metal patterns to be formed. The remaining spacer nitride in the double spacer has a width used for spacing between metal patterns of the group of metal patterns to be formed. The remaining spacer oxide in the double spacer has a width used for a width of metal patterns of the group of metal patterns to be formed. A series of fabrication process steps follow where particular areas of the semiconductor structure are etched in a particular order to form the groups of metal patterns. In the following description, FIGS. 1-2 illustrate the layout used for the standard cell using the groups of metal tracks. FIGS. 3-12 illustrate cross-sectional views of the semiconductor structure being fabricated. FIGS. 13-14 provide steps of a method for fabricating the semiconductor structure. FIGS. 15-23 illustrate cross-sectional views of the semiconductor structure being further fabricated to create the groups of metal patterns. FIG. 24 provides steps of a method for further fabricating the semiconductor structure in order to create the groups of metal patterns. FIGS. 25-33 illustrate cross-sectional views of the semiconductor structure being further fabricated with alternate processing steps to create the groups of metal patterns. FIG. 34 provides steps of a method for further fabricating the semiconductor structure with alternate processing steps in order to create the groups of metal patterns.

Referring to FIG. 1, a generalized block diagram of a top view of a standard cell layout 100 is shown. Here, the active regions are not shown in the standard cell layout 100 for ease of illustration. In the illustrated embodiment, the standard cell layout 100 is for a six device multiplexer. However, the fabrication techniques shown in FIGS. 3-23 and 24-33 can be used for a variety of other standard cells used for other complex gates and functional units. As used herein, device is also referred to as transistor. For the six device multiplexer, the PMOS FETS (p-type metal oxide semiconductor field effect transistors, or pfets) are at the top of the standard cell layout 100. The NMOS FETS (n-type metal oxide semiconductor field effect transistors, or nfets) are at the bottom of the standard cell layout 100.

In various embodiments, the transistors in the standard cell layout 100 are non-planar transistors. Non-planar transistors are a relatively recent development in semiconductor processing for reducing short channel effects. Tri-gate transistors, Fin field effect transistors (FETs) and gate all around (GAA) transistors are examples of non-planar transistors. Next, the materials used in the layout 100 are described.

As shown, the standard cell layout 100 uses metal gate 110 in a vertical direction, trench silicide contacts 120 for the source and drain regions in the vertical direction, and metal 0 (M0 or Metal0) 130 for local interconnections in the horizontal direction. In one embodiment, a self-aligned gate and local interconnect process in addition to a gate open contact process is used to create the full trench silicide straps. As shown, contacts 140 are used for connecting the metal gate 110 to Metal0 130 and contacts 142 are used for connecting the trench silicide contact 120 to Metal0 130. The standard cell layout 100 additionally uses metal 1 (M1 or Metal1) 150 for local interconnections in the vertical direction and vias 152 for connecting the horizontal interconnect Metal0 130 to the vertical interconnect Metal1 150.

Layout 100 uses power pins at the top and ground pins at the bottom. As shown, layout 100 does not use power rails anywhere. The vertical Metal1 150 routing at the top provides flexible connection to horizontal metal 2 (M2 or Metal2) 170 for creating power connections. The vertical Metal1 150 routing at the bottom provides flexible connection to Metal2 170 tracks for creating ground connections. The vias 160 are used to connect the vertical Metal1 150 tracks to the horizontal Metal2 170 tracks. As shown, connections using the vias 160 are made in each of the four corners of layout 100.

In the illustrated embodiment, the layout 100 uses a group 102 at the top for routing three horizontal signal routes with the horizontal Metal0 130 local interconnect. In addition, the layout 100 uses a group 104 at the bottom for routing three horizontal signal routes with the horizontal Metal0 130 local interconnect. Each of the groups 102 and 104 uses three horizontal tracks for routing three horizontal signal wires with a given width and pitch. The groups 102 and 104 are also referred to as "triplet" groups. Although each of the groups 102 and group 104 is shown to use three horizontal tracks, in other embodiments, any other number of multiple horizontal tracks is used. A spacing exists between the two groups 102 and 104, which can be used for additional signal routing tracks beyond the multiple horizontal tracks used in the groups 102 and 104.

In some embodiments, the devices in the standard cell layout 100 are fabricated by one of the many fabrication techniques. Examples of the fabrication techniques are one of many immersion lithography techniques, the double patterning technique, the extreme ultraviolet lithography (EUV) technique, and the directed self-assembly (DSA) lithography technique. In some embodiments, the EUV technique provides more flexibility relative to via and contact modules relative to other techniques.

Fabrication techniques have a variety of issues. One issue is throughput, which is a rate of the number of wafers or dies produced per unit time such as per hour or per day. A second issue is yield, which is the number of productive dies able to be used in a product compared to the total number of dies fabricated. A third issue is resolution, which is the smallest feature the fabrication process is able to produce. For example, an example of the feature is the length of a transistor (device). The fabrication process is able to place a source region and a drain region, which are two separate but adjacent regions, next to each other with a smallest distance between them that the two regions are still distinguished from one another. The distance is the length of the transistor being fabricated, which is the feature (and the resolution).

Another example of the feature is the distance between two metal wires. The smallest distance between the mid-point of a first metal wire of a particular metal layer and the mid-point of a second metal wire of the same particular metal layer is the pitch. In addition, another example is the smallest width of a metal wire for a particular metal layer. The fabrication process has multiple distances used to characterize the fabrication process. Each of the multiple distances is the smallest distance used for a particular material of the many different materials on the die to provide a target yield. The smallest distance of all of these distances is used to define the resolution of the fabrication process. The other distances are used for design rules to ensure reliable circuit fabrication based on the targeted yield.

In the illustrated embodiment, the relatively high resolution provided by the selected fabrication technique allows for 3 locations for contacts to be placed on the trench silicide contact 120 and the metal gate 110 where they interconnect with either the group 102 or the group 104. The 3 locations provide efficient signal and power routing within the standard cell so that it becomes less likely to use another metal layer other than the horizontal Metal0 130 local interconnect. For example, the pfets at the top of layout 100 have access to three potential locations for contacts within the group 102.

Similar to the pfets having access to three potential locations for contacts within the group 102, the nfets at the bottom of layout 100 have access to three potential locations for contacts within the group 104. The flexibility offered by the three potential locations for contacts within groups 102 and 104 eliminates using other metal interconnects, such as vertical Metal 1 or horizontal Metal 2, and the corresponding contacts for routing signals and power. Again, although each of the groups 102 and group 104 is shown to use three horizontal tracks, in other embodiments, any other number of multiple horizontal tracks is used. Therefore, another number of potential locations for using contacts in the groups 102 and 104 for trench silicide contact 120 and the metal gate 110 is also possible and contemplated.

Referring to FIG. 2, a generalized block diagram of another top view of a standard cell layout 200 is shown. Layout elements described earlier are numbered identically. Here, the layout 200 is the same as the layout 100, but for ease of illustration, layout 200 only shows the metal gates 110, the trench silicide contacts 120, the Metal0 130, contacts 140 for connecting the metal gate 110 to Metal0 130, and contacts 142 for connecting the trench silicide contact 120 to Metal0 130.

The horizontal groups 102 and 104 of Metal0 130 are shown again. The layout 200 uses group 102 at the top for routing three horizontal signal routes with the horizontal Metal0 130 local interconnect. In addition, the layout 200 uses group 104 at the bottom for routing three horizontal signal routes with the horizontal Metal0 130 local interconnect. A spacing 230 exists between the two groups 102 and 104, which can be used for additional signal routing tracks.

The relatively high resolution provided by the selected fabrication technique allows for many locations for contacts to be placed on the trench silicide contact 120 and the metal gate 110. Here, the number of locations is shown as 3 locations for the 3 horizontal tracks within each of the groups 102 and 104. However, any other number of multiple tracks, and thus potential locations for contacts, is possible and contemplated. The locations for contacts provide efficient signal and power routing within the standard cell so that it becomes less likely to use another metal layer other than the horizontal Metal0 130 local interconnect.

In some embodiments, the extreme ultraviolet lithography (EUV) technique is used to provide the resolution of each of the width and the pitch of the horizontal Metal0 130 routes in the groups 102 and 104. The EUV technique uses an extreme ultraviolet wavelength to reach resolution below 40 nanometers. The extreme ultraviolet wavelength is approximately 13.5 nanometers. Relatively high temperature and high density plasma is used to provide the EUV beam.

In other embodiments, the resolution of each of the width and the pitch of the horizontal Metal0 130 routes in the groups 102 and 104 is set by the immersion lithography technique. Immersion lithography uses a liquid medium, such as purified water, between the lens of the imaging equipment and the wafer surface. Previously, the gap space was simply air. The resolution achieved by this technique is the resolution of the imaging equipment increased by the refractive index of the liquid medium. In some examples, the increased resolution falls above 80 nanometers.

In other embodiments, the double patterning technique is used to provide the resolution of each of the width and the pitch of the horizontal Metal0 130 routes in the triplet groups 102 and 104. The double patterning technique uses immersion lithography systems to define features with resolution between 40 and 80 nanometers. Either of the self-aligned doubled patterning (SADP) technique or the litho-etch-litho-etch (LELE) technique is used. The double patterning technique counteracts the effects of diffraction in optical lithography, which occurs when the minimum dimensions of features on a wafer are less than the 193 nanometer wavelength of the illuminating light source. Other examples of techniques used to counteract the effects of diffraction in optical lithography are phase-shift masks, optical-proximity correction (OPC) techniques, optical equipment improvements and computational lithography.

When selecting between immersion lithography, double patterning, EUV and DSA techniques, and other techniques, cost is considered as the cost increases from immersion lithography to EUV. However, over time, the costs of these techniques adjust as well as additional and newer techniques are developed for providing relatively high resolution for the width and the pitch of the horizontal Metal0 130 routes in the groups 102 and 104. Accordingly, one of a variety of lithography techniques is used to provide relatively high resolution for the width and the pitch. In the upcoming description of FIGS. 3-23, the fabrication steps for a double spacer immersion lithography triple patterning technique are described which provide the resolution of each of the width and the pitch of the horizontal Metal0 130 routes in the groups 102 and 104.

Figure 3:
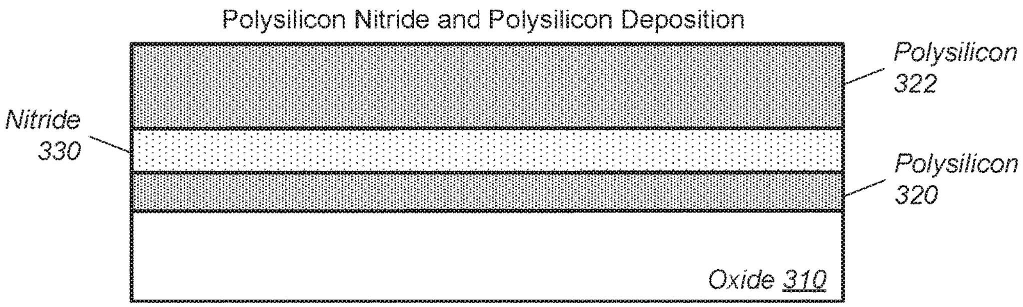
FIG. 3 is a generalized diagram of a cross-sectional view of semiconductor metal patterns being fabricated.

Turning to FIG. 3, a generalized block diagram of a cross-sectional view of semiconductor metal patterns being fabricated is shown. Here, a stack of layers is deposited on an oxide layer 310 of a controlled thickness. In various embodiments, the oxide layer 310 is an inter-level dielectric (ILD). The ILD is used to insulate metal layers which are used for interconnects. In some embodiments, the ILD is silicon dioxide. In other embodiments, the ILD is one of a variety of low-k dielectrics containing carbon or fluorine. The low-k dielectrics provide a lower capacitance between the metal layers, and thus, reduces performance loss, power consumption and cross talk between interconnect routes.

In the illustrated embodiment, the stack of layers uses a polysilicon layer 320 on top of the oxide layer 310, a nitride layer 330 on top of the polysilicon layer 320, and another polysilicon layer 322 on top of the nitride layer 330. In various embodiments, the nitride layer 330 is silicon nitride (SiN).

Figure 4:
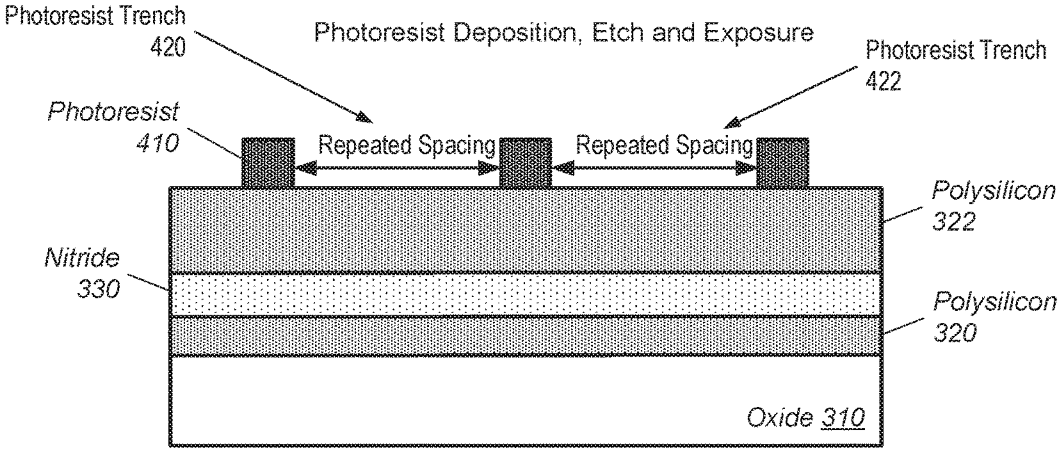
FIG. 4 is a generalized diagram of another cross-sectional view of semiconductor metal patterns being fabricated.

Referring to FIG. 4, a generalized block diagram of another cross-sectional view of semiconductor metal patterns being fabricated is shown. For FIGS. 4-23, process materials described earlier are numbered identically. Here in FIG. 4, a photoresist layer 410 is formed on top of the top-most polysilicon layer 322 and etched with repeating and relatively same-sized spacing. In various embodiments, the etching with this repeated spacing forms trenches 420 and 422 in the photoresist 410 that are approximately equally spaced. One of a variety of lithography techniques is used to reduce the pitch (increase the frequency) of the trenches 420 and 422 in the photoresist 410.

The area on the polysilicon layer 322 within these trenches 420 and 422 in the photoresist 410 is the area to be used for creating metal wires by fabricating semiconductor metal patterns. For example, referring briefly again to FIG. 2, each of the groups 102 and 104 are shown with three horizontal signal tracks with the horizontal Metal0 130 local interconnect. In various embodiments, these three horizontal signal tracks are fabricated within the trenches 420 and 422, which will be shown in later steps of the fabrication process. Again, although each of the groups 102 and 104 is shown to use three horizontal tracks, in other embodiments, any other number of multiple horizontal tracks is used. As described earlier, the spacing 230 shown in FIG. 2 between the two groups 102 and 104 provides additional signal routing tracks beyond the multiple horizontal tracks used in the groups 102 and 104. In FIG. 4, the width of the remaining photoresist 410 on the polysilicon layer 322 determines the spacing 230 between the groups 102 and 104. Therefore, to increase the spacing 230 between the groups 102 and 104, the width of the remaining photoresist 410 on the polysilicon layer 322 is made wider.

Figure 5:
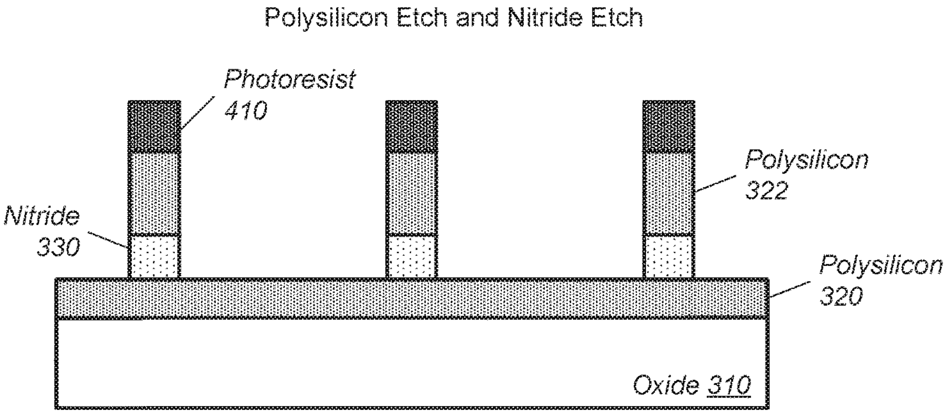
FIG. 5 is a generalized diagram of another cross-sectional view of semiconductor metal patterns being fabricated.

Turning to FIG. 5, a generalized block diagram of another cross-sectional view of semiconductor metal patterns being fabricated is shown. As shown, the semiconductor device fabrication process etches trenches into areas of the top-most polysilicon layer 322 unprotected by the photoresist layer 410. Following, the process etches trenches into areas of the nitride layer 330 unprotected by the photoresist layer 410 resulting in the shown cross-sectional view.

Figure 6:
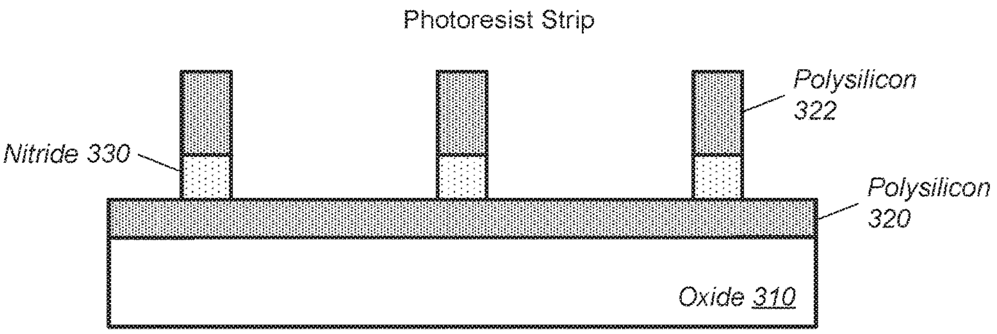
FIG. 6 is a generalized diagram of another cross-sectional view of semiconductor metal patterns being fabricated.
Figure 7:
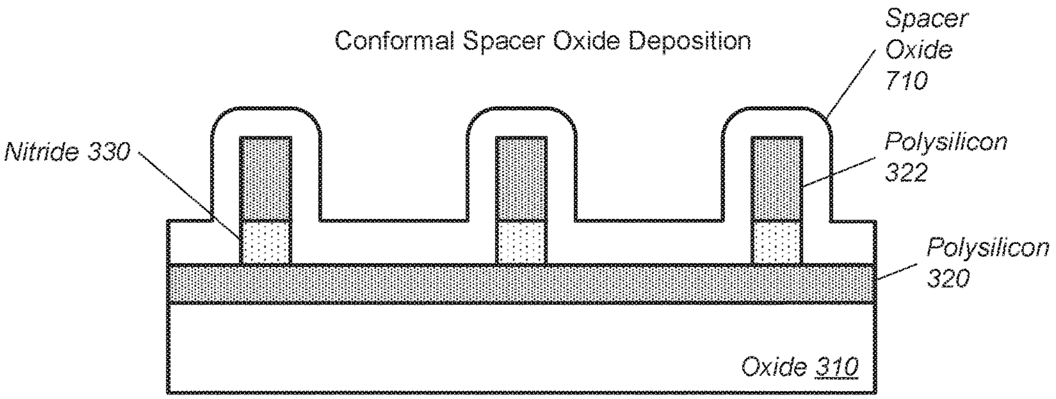
FIG. 7 is a generalized diagram of another cross-sectional view of semiconductor metal patterns being fabricated.
Figure 8:
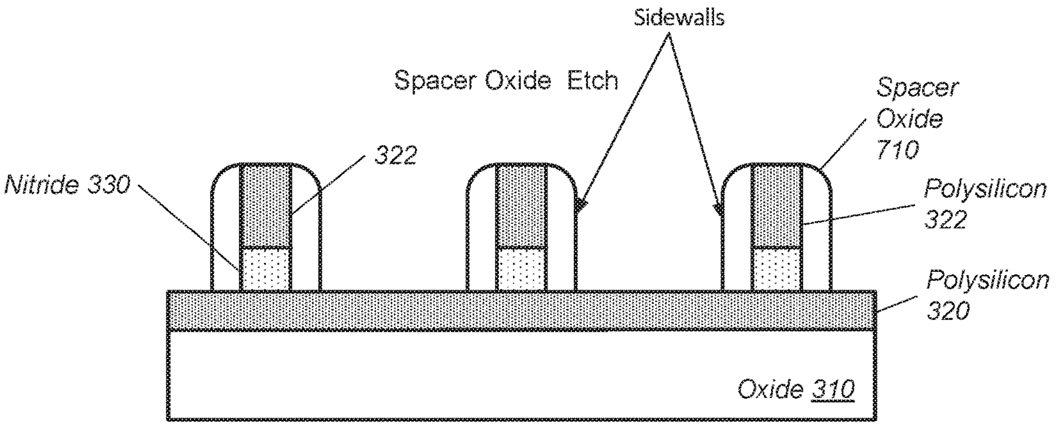
FIG. 8 is a generalized diagram of another cross-sectional view of semiconductor metal patterns being fabricated.

Referring to FIGS. 6-8, generalized block diagrams of other cross-sectional views of semiconductor metal patterns being fabricated are shown. In FIG. 6, the photoresist layer 410 is stripped. In FIG. 7, the semiconductor device fabrication process deposits a conformal spacer oxide layer 710 over the top-most polysilicon layer 322, the nitride layer 330 and the bottom polysilicon layer 320. In FIG. 8, the semiconductor device fabrication process, which is also referred to as the fabrication process, etches the spacer oxide layer 710 leaving sidewalls of spacer oxide 710 on either side of the top-most polysilicon layer 322 and the nitride layer 330.

Figure 9:
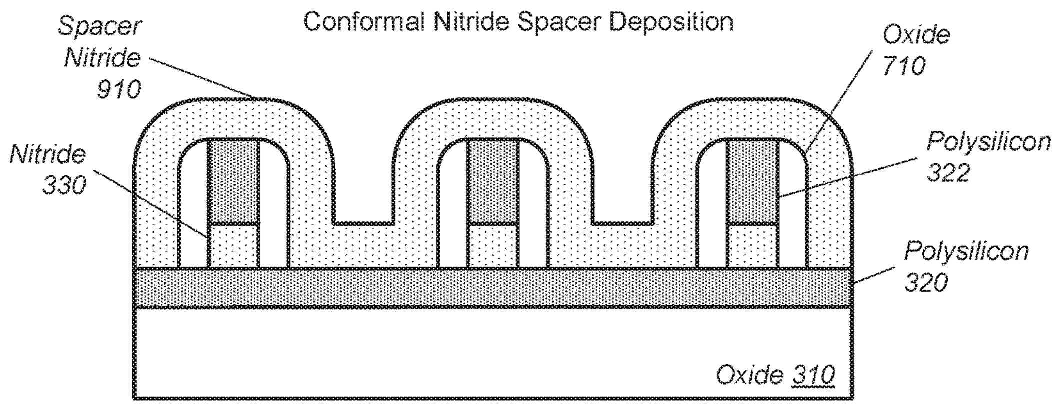
FIG. 9 is a generalized diagram of another cross-sectional view of semiconductor metal patterns being fabricated.
Figure 10:
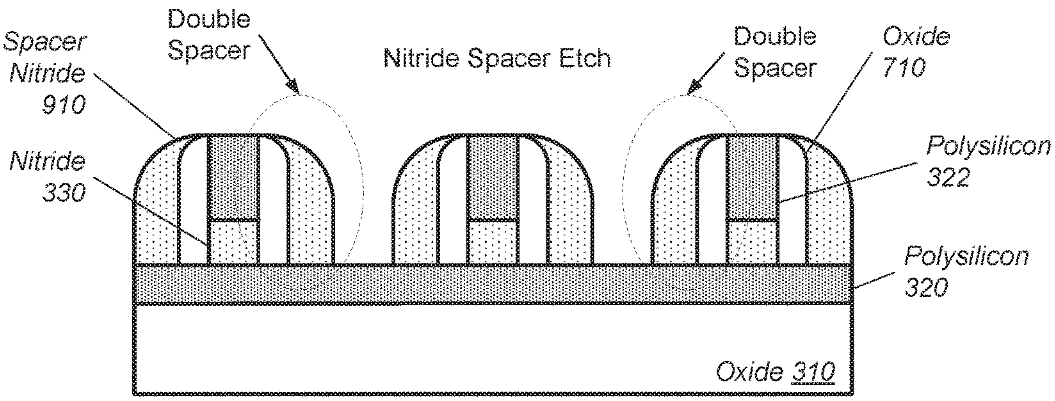
FIG. 10 is a generalized diagram of another cross-sectional view of semiconductor metal patterns being fabricated.

Turning now to FIGS. 9-10, generalized block diagrams of other cross-sectional views of semiconductor metal patterns being fabricated are shown. As shown in FIG. 9, a conformal nitride layer 910 is deposited over the spacer oxide layer 710 and the polysilicon layer 322. Following, the spacer nitride layer 910 is etched as shown in FIG. 10. Each of the spacer oxide layer 710 and the spacer nitride layer 910 form a double spacer around the mandrel which includes the polysilicon 322 and the nitride 330.

Figure 11:
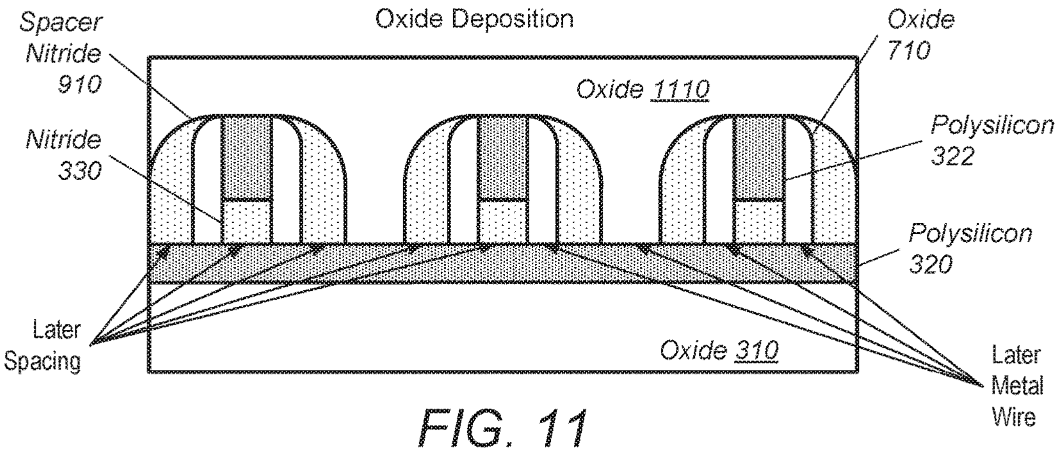
FIG. 11 is a generalized diagram of another cross-sectional view of semiconductor metal patterns being fabricated.
Figure 12:
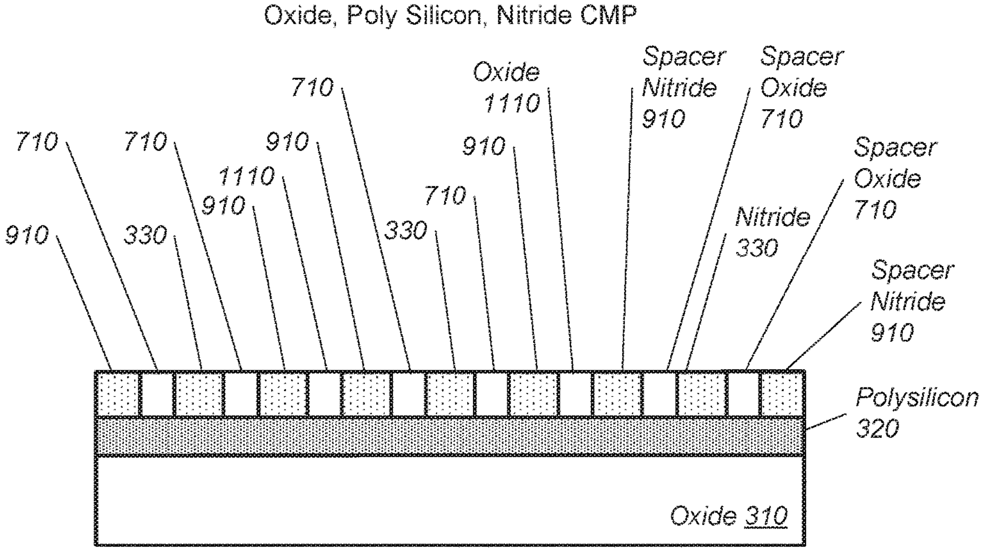
FIG. 12 is a generalized diagram of another cross-sectional view of semiconductor metal patterns being fabricated.
Figure 13:
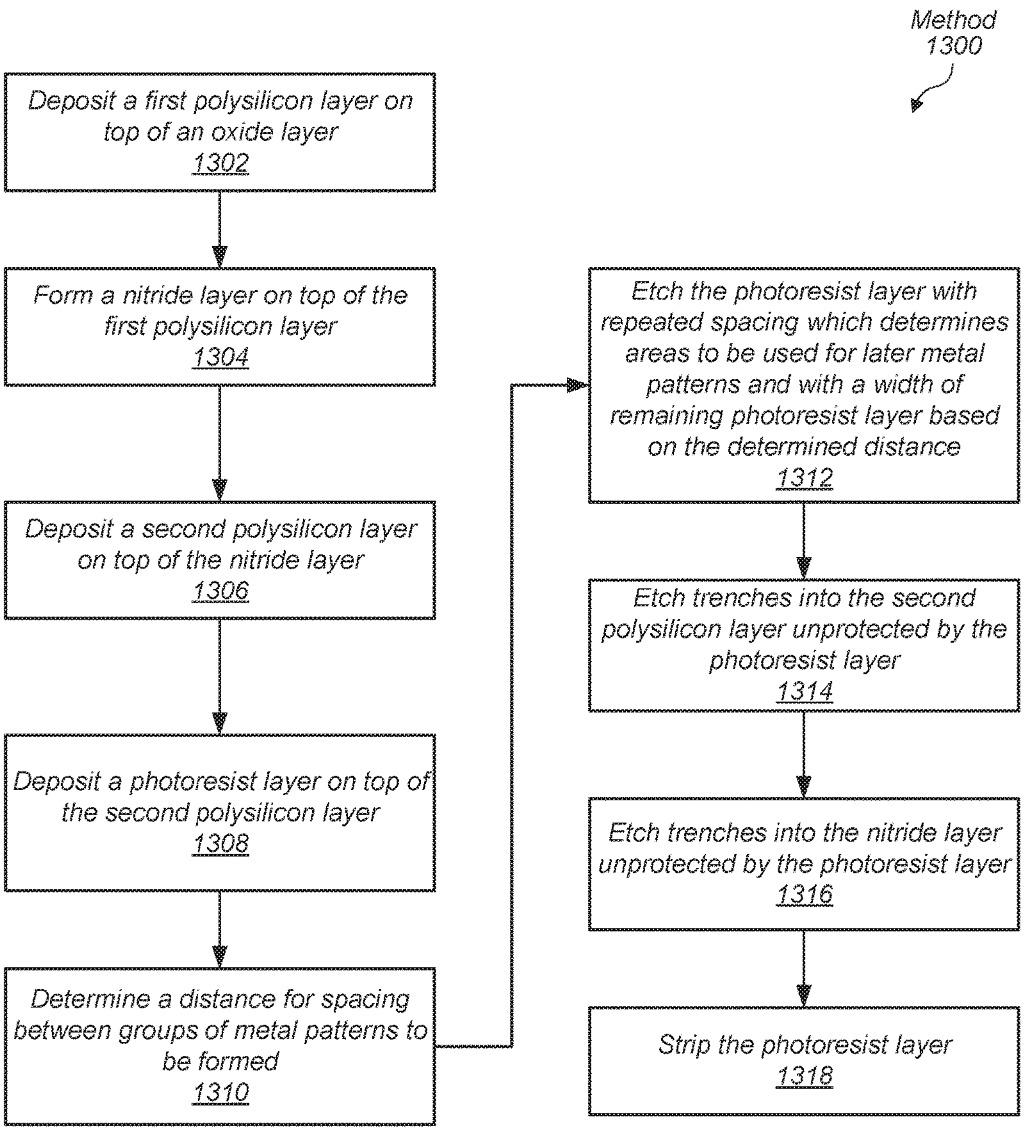
FIG. 13 is a generalized diagram of a method for fabricating metal patterns to be used for metal tracks.

Referring to FIGS. 11-12, generalized block diagrams of other cross-sectional views of semiconductor metal patterns being fabricated are shown. In FIG. 11, the oxide layer 1110 is deposited over the spacer nitride layer 910 and the mandrels. Where the oxide layer 710 and the oxide layer 1110 contact the polysilicon layer 320 is shown in a later fabrication step to define the areas where metal will be deposited for metal wires. In addition, shown in a later fabrication step, where the nitride layers 330 and 910 contact the polysilicon layer 320 define areas used for spacing between the metal wires to be deposited. Although the diagram is not drawn to scale, it can be seen adjusting the widths of the nitride layers 330 and 910 in addition to the widths of the oxide layers 710 and 1110 making contact with the polysilicon layer 320 defines the widths and spacing used for the upcoming metal patterns. This semiconductor structure illustrated in FIG. 11 is used by one of multiple further fabrication steps to create the groups of metal patterns and any extra metal tracks in the spacing between the groups of metal patterns.

In FIG. 12, the fabrication process uses a chemical mechanical planarization (CMP) step to remove multiple layers shown earlier in FIG. 11 until the nitride layer 330 is reached. The multiple layers are the oxide layer 1110, the spacer nitride layer 910, the polysilicon 322, and the spacer oxide layer 710. The polysilicon layer 322 is completely removed in the illustrated embodiment. The CMP step polishes the remaining material corresponding to the layers

322, 710, 910 and 1110. The CMP step achieves a near-perfect flat and smooth surface upon which further layers are built. The flat and smooth surface contains alternating oxide and nitride regions on top of the polysilicon layer 320.

Turning now to FIG. 13, one embodiment of a method 1300 for fabricating metal patterns to be used for metal tracks is shown. For purposes of discussion, the steps in this embodiment (as well as in FIGS. 14, 24 and 34) are shown in sequential order. However, in other embodiments some steps occur in a different order than shown, some steps are performed concurrently, some steps are combined with other steps, and some steps are absent.

In various embodiments, an oxide layer is formed on top of a substrate. In some embodiments, a plasma-enhanced chemical vapor deposition (PECVD) process is used to place the oxide layer on the substrate. A first polysilicon layer is deposited on top of the oxide layer (block 1302). Afterward, a nitride layer is formed on top of the first polysilicon layer (block 1304). In various embodiments, the nitride layer is silicon nitride (SiN). Following, a second polysilicon layer is formed on the nitride layer (block 1306). In some embodiments, the second polysilicon layer has a thickness greater than the thickness of the first polysilicon layer.

A photoresist layer is formed on top of the second polysilicon layer (block 1308). A distance for spacing between groups of metal patterns to be formed is determined (block 1310). The determined distance sets the spacing between the groups of metal patterns to be formed later. Briefly referring again to FIG. 2, the spacing 230 can be used for additional signal routing tracks between the groups 102 and 104. The determined distance sets the width of the remaining photoresist on the second polysilicon layer after an etching fabrication step (block 1312).

The etching is done to create particular spacing between the remaining photoresist and to set the width of the remaining photoresist based on the determined distance. The spacing between the remaining photoresist sets the area for a group of metal patterns to be formed later. Therefore, to increase the spacing between groups of later metal patterns, the determined distances is increased and the width of the remaining photoresist on the polysilicon layer will be made wider. Similarly, to decrease the spacing between groups of later metal patterns, the determined distance is decreased and the width of the remaining photoresist on the polysilicon layer will be reduced.

Trenches are etched into areas of the second polysilicon layer unprotected by the photoresist layer (block 1314). Following, trenches are etched into areas of the nitride layer unprotected by the photoresist layer (block 1316). Afterward, the photoresist layer is stripped (block 1318). The resulting columns (mandrels) on the first polysilicon layer contain the second polysilicon layer on top of the nitride layer.

Referring to FIG. 14, one embodiment of a method 1400 for fabricating metal patterns to be used for metal tracks is shown. A conformal spacer oxide layer is deposited over a first polysilicon layer and mandrels (columns) on top of the first polysilicon layer (block 1402). In various embodiments, the columns contain a second polysilicon layer on top of a nitride layer. The conformal spacer oxide layer is etched (block 1404) leaving sidewalls of spacer oxide on either sides of the mandrels. The thickness of the remaining spacer oxide layer on the sidewalls of the mandrels sets the width of a metal pattern to be formed later.

A conformal spacer nitride layer is deposited over exposed areas of the first polysilicon layer and over the mandrels (columns) on top of the first polysilicon layer (block 1406). The conformal spacer nitride layer is etched (block 1408) leaving sidewalls of spacer nitride on either sides of the mandrels. The thickness of the remaining spacer nitride layer on the sidewalls of the mandrels sets the width of spacing between metal patterns to be formed later. Accordingly, this width is used to set the pitch between metal patterns to be formed later. Each of the remaining sidewall spacer oxide layer and spacer nitride layer form a double spacer around the mandrels.

An oxide layer is deposited over the exposed areas of the first polysilicon layer and the double spacer (block 1410). Each of the deposited top-most oxide layer, the double spacer and the mandrels are removed until the nitride layer 330 is reached (block 1412). The multiple layers removed are the top-most deposited oxide layer, a portion of the spacer nitride layer within the double spacer, a portion of the spacer oxide layer within the double spacer, and the entire second polysilicon layer within the mandrels. In various embodiments, a chemical mechanical planarization (CMP) step is used to remove these multiple layers and to polish the remaining material. The CMP step achieves a near-perfect flat and smooth surface upon which further layers are built.

Figure 15:
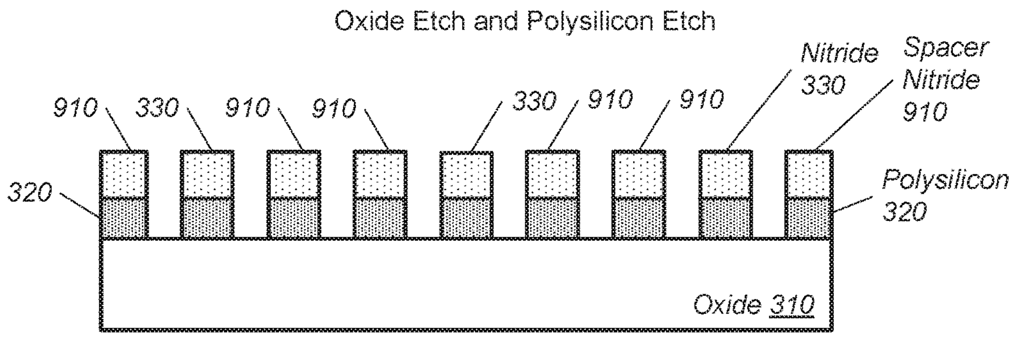
FIG. 15 is a generalized diagram of another cross-sectional view of semiconductor metal patterns being fabricated.
Figure 16:
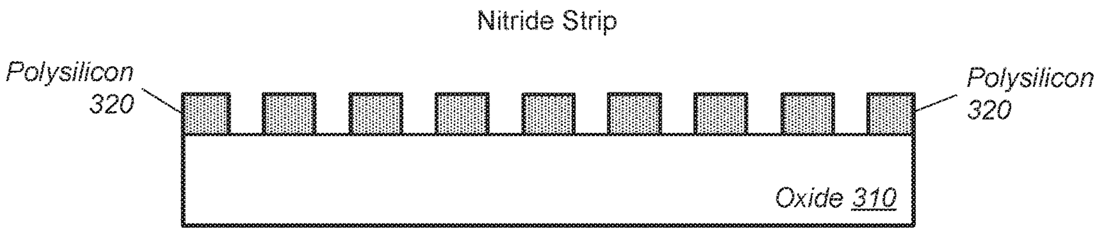
FIG. 16 is a generalized diagram of another cross-sectional view of semiconductor metal patterns being fabricated.

Referring to FIGS. 15-16, generalized block diagrams of other cross-sectional views of semiconductor metal patterns being fabricated are shown. In FIG. 15, each of the oxide layers 710 and 1110 in addition to the polysilicon layer 320 are etched until the oxide layer 310 is reached. Regions for later metallization are further created. In FIG. 16, the nitride layer 330 and the spacer nitride layer 910 are stripped leaving the polysilicon layer 320 exposed.

Figure 17:
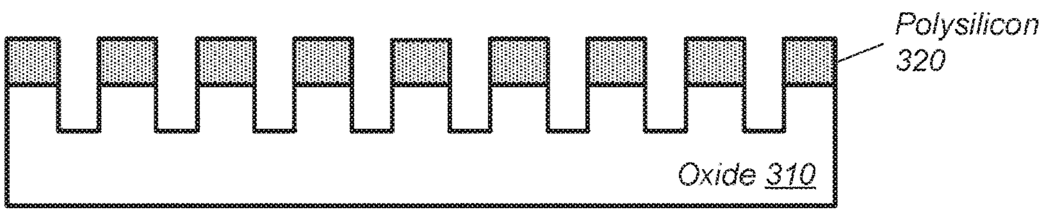
FIG. 17 is a generalized diagram of another cross-sectional view of semiconductor metal patterns being fabricated.
Figure 18:
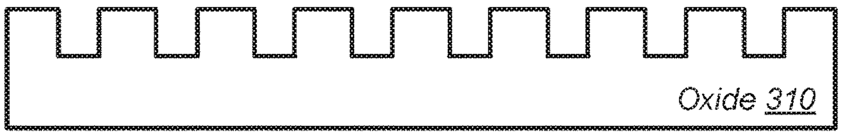
FIG. 18 is a generalized diagram of another cross-sectional view of semiconductor metal patterns being fabricated.
Figure 19:
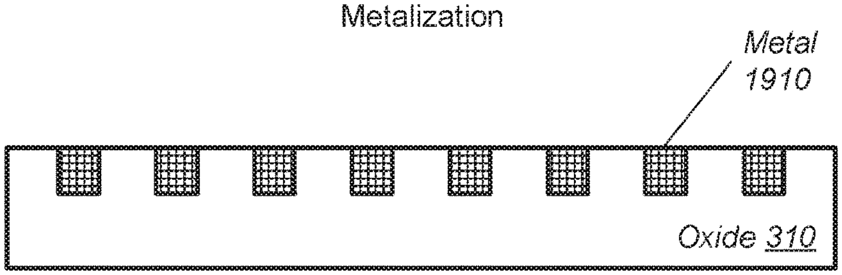
FIG. 19 is a generalized diagram of another cross-sectional view of semiconductor metal patterns being fabricated.

Turning to FIGS. 17-19, generalized block diagrams of other cross-sectional views of semiconductor metal patterns being fabricated are shown. In these diagrams, further etching is performed in addition to metallization. In FIG. 17, the fabrication process etches trenches into areas of the oxide layer 310 which are unprotected by the polysilicon layer 320. In FIG. 18, the polysilicon layer 320 is etched away followed by a metallization step shown in FIG. 19. The metallization step deposits the metal layer 1910 in the etched trenches. Referring briefly again to FIG. 10, it can be seen the width of the metal wires is set by the width of the oxide layer 710 of the double spacer making contact with the polysilicon layer 320 and the width of the oxide layer 1110 making contact with the polysilicon layer 320. The spacing between the metal wires is set by the width of the nitride layer 330 shown in FIG. 10. The spacing between the metal wires is also set by the width of the nitride layer 910 of the double spacer.

In one embodiment, the metal layer 1910 is copper. In another embodiment, the metal layer 1910 is aluminum or a copper and aluminum mix. In some embodiments, the metal layer 1910 is formed by a dual damascene process. In other embodiments the metal layer 1910 formed by a single damascene process. Other techniques are possible and contemplated for forming the metal layer 1910. In embodiments with copper used as the metal layer 1910, a liner using a tantalum (Ta) based barrier material is deposited on the inter-level dielectric (ILD), which is the oxide layer 310, before the metal layer 1910 is formed. The liner prevents the copper from diffusing into the oxide layer 310 and acts as an adhesion layer for the copper. Next a thin copper seed layer is deposited by physical vapor diffusion (PVD) followed by electroplating of copper. In other embodiments, cobalt, tungsten, other metals or carbon nanotubes are used in place of copper.

Figure 20:
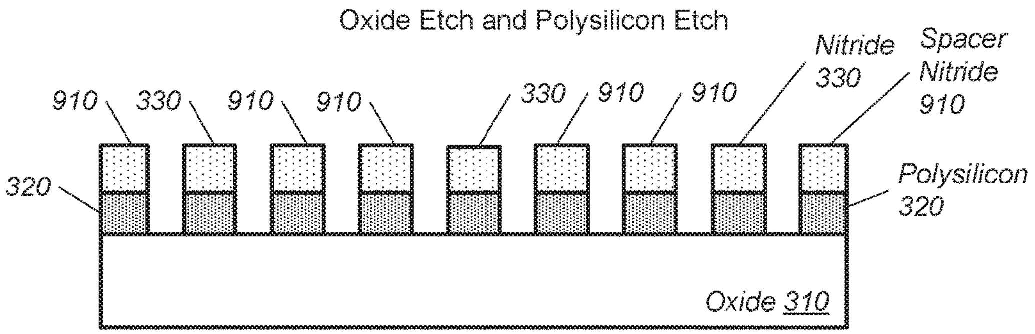
FIG. 20 is a generalized diagram of another cross-sectional view of semiconductor metal patterns being fabricated.
Figure 21:
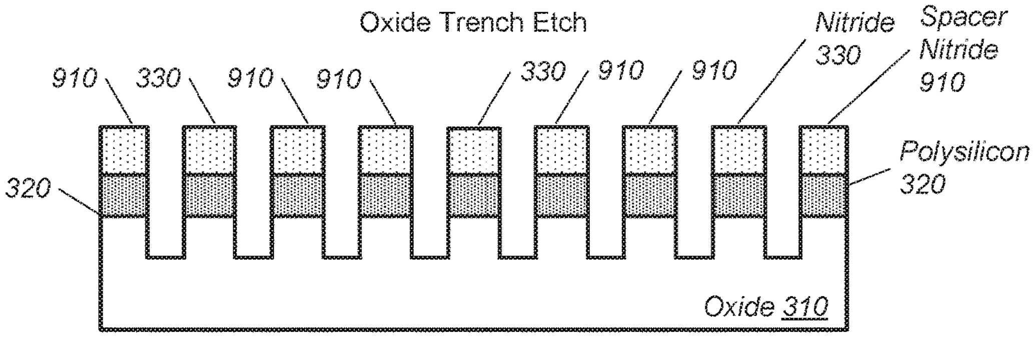
FIG. 21 is a generalized diagram of another cross-sectional view of semiconductor metal patterns being fabricated.
Figure 22:
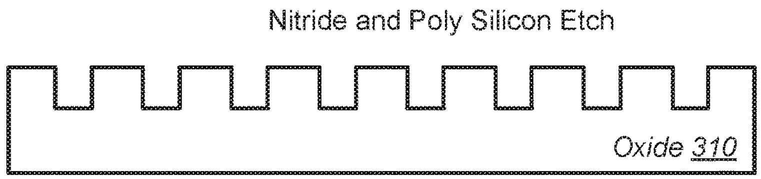
FIG. 22 is a generalized diagram of another cross-sectional view of semiconductor metal patterns being fabricated.
Figure 23:
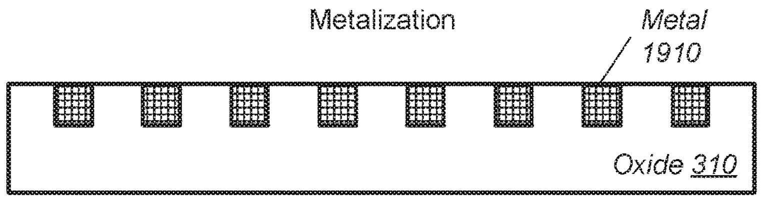
FIG. 23 is a generalized diagram of another cross-sectional view of semiconductor metal patterns being fabricated.

Referring to FIGS. 20-23, generalized block diagrams of other cross-sectional views of semiconductor metal patterns being fabricated are shown. FIGS. 20-23 illustrate alternative steps to use in the fabrication process compared to the steps described above for FIGS. 15-19. Here, FIG. 20 is the same as the earlier FIG. 15 where each of the oxide layers 710 and 1110 in addition to the polysilicon layer 320 are etched until the oxide layer 310 is reached, and thus, creating regions for later metallization. FIG. 20 shows each of the oxide layers 710 and 1110 in addition to the polysilicon 320 are etched until the oxide layer 310 is reached. FIG. 20 shows the etching steps after the CMP step to remove multiple layers shown earlier in FIG. 11 until the nitride layer 330 is reached. In FIG. 21, the fabrication process etches trenches into areas of the oxide layer 310 unprotected by the nitride layers 330 and 910 as well as the polysilicon layer 320. In FIG. 22, each of the nitride layers 330 and 910 as well as the polysilicon layer 320 are etched away followed by a metallization step shown in FIG. 23.

Turning now to FIG. 24, one embodiment of a method 2400 for fabricating metal patterns to be used for metal tracks is shown. A flat and smooth surface contains alternating oxide and nitride regions on top of a polysilicon layer. An oxide layer is below the polysilicon layer. Therefore, the multiple layers contain the oxide layer at the bottom and a polysilicon layer on top of the oxide layer. On top of the polysilicon layer are the alternating regions of polished oxide and nitride regions. In some embodiments, the widths of the alternating regions of polished oxide and nitride regions are relatively the same. The oxide region of the alternating oxide and nitride regions is etched and removed from the top of the polysilicon layer (block 2402).

The exposed portions of the polysilicon layer in the same regions as the previously removed oxide are removed (etched) until the oxide layer underneath the polysilicon layer is reached (block 2404). In some embodiments, trenches are etched at this time into the oxide layer below the polysilicon layer. In other embodiments, the trenches are created later. If the trenches are etched later ("no" branch of the conditional block 2406), then the top alternating nitride regions are removed exposing the alternating polysilicon regions (block 2408). Following, the trenches are etched in the oxide layer below the alternating polysilicon regions where the below oxide layer is unprotected by the alternating polysilicon regions (block 2410). Next, the alternating polysilicon regions are removed (block 2412). Afterward, a metallization step deposits metal in the etched trenches (block 2418). In one embodiment, the metal is copper. In another embodiment, the metal is aluminum or a copper and aluminum mix. In other embodiments, cobalt, tungsten, other metals or carbon nanotubes are used.

However, if the trenches are etched after the exposed portions of the polysilicon layer are removed ("yes" branch of the conditional block 2406), then the trenches are etched in the oxide layer below the alternating nitride and polysilicon mandrels where the below oxide layer is unprotected by the alternating mandrels (block 2414). Following, the top alternating nitride in the mandrels are removed exposing the alternating polysilicon regions (block 2416). Afterward, control flow of method 2400 moves to block 2412 where the alternating polysilicon regions are removed.

Figure 25:
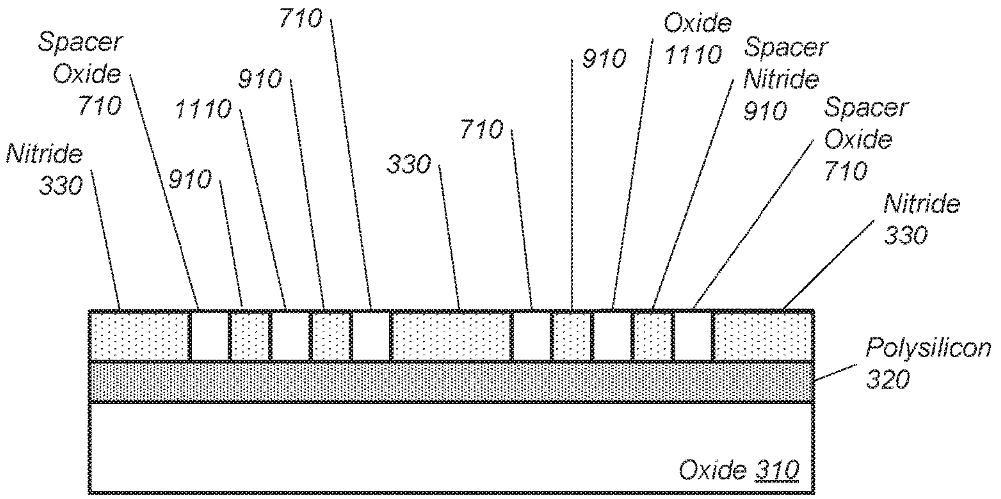
FIG. 25 is a generalized diagram of a cross-sectional view of semiconductor metal patterns being fabricated using alternative steps.

Referring to FIGS. 25-33, generalized block diagrams of other cross-sectional views of semiconductor metal patterns being fabricated are shown. FIGS. 25-33 illustrate alternative steps to use in the fabrication process compared to the steps described above for FIGS. 15-23. Here, FIG. 25 is the same as the earlier FIG. 12 where the fabrication process uses a chemical mechanical planarization (CMP) step to remove multiple layers shown earlier in FIG. 11 until the nitride layer 330 is reached.

As described earlier, the nitride layer 330 is not used within the double spacer constructed as shown earlier in FIGS. 10-11. Instead, the spacer nitride layer 910 is used to construct the double spacer. As shown in FIG. 25, the width of the nitride layer 330 in particular areas on the polysilicon layer 320, such as the far left, the far right and the center areas, is larger than the width of the nitride layer 330 used in other areas. As described earlier regarding FIG. 4, the width of the nitride layer 330 is used to define the width of spacing between metal patterns used for metal wires. The larger widths used for the nitride layer 330 in FIG. 25 are used to define spacing between the metal patterns to be fabricated.

Figure 26:
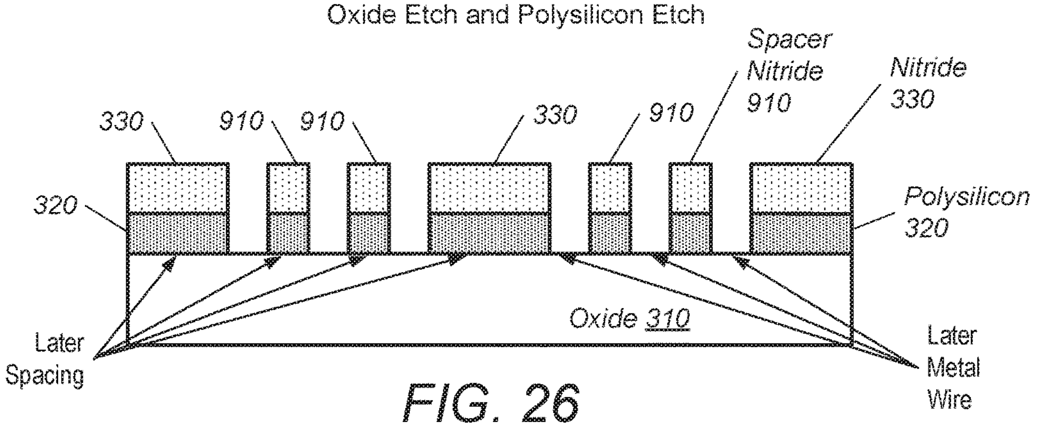
FIG. 26 is a generalized diagram of another cross-sectional view of semiconductor metal patterns being fabricated using alternative steps.
Figure 27:
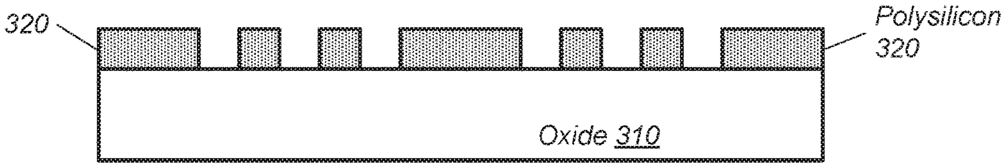
FIG. 27 is a generalized diagram of another cross-sectional view of semiconductor metal patterns being fabricated using alternative steps.

Referring now to FIG. 26, each of the oxide layers 710 and 1110 in addition to the polysilicon layer 320 are etched until the oxide layer 310 is reached. Regions for later metallization are created by this etching. As shown, the widths for spacing between metal patterns alternates between relatively narrow to relatively wide. For example, as shown, the far left, the far right and the middle columns (mandrels) are wider than the other columns. The columns use the nitride layers 330 and 910 on the top along with polysilicon layer 320 on the bottom. In FIG. 27, the nitride layer 330 and the spacer nitride layer 910 are stripped from the tops of the columns leaving the polysilicon layer 320 exposed.

Figure 28:
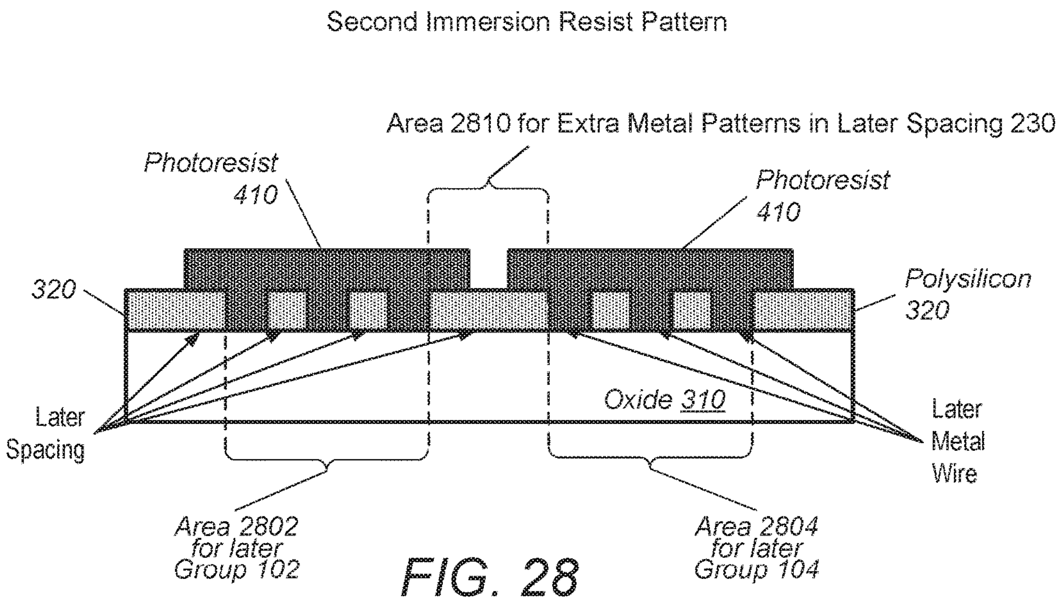
FIG. 28 is a generalized diagram of another cross-sectional view of semiconductor metal patterns being fabricated using alternative steps.
Figure 29:
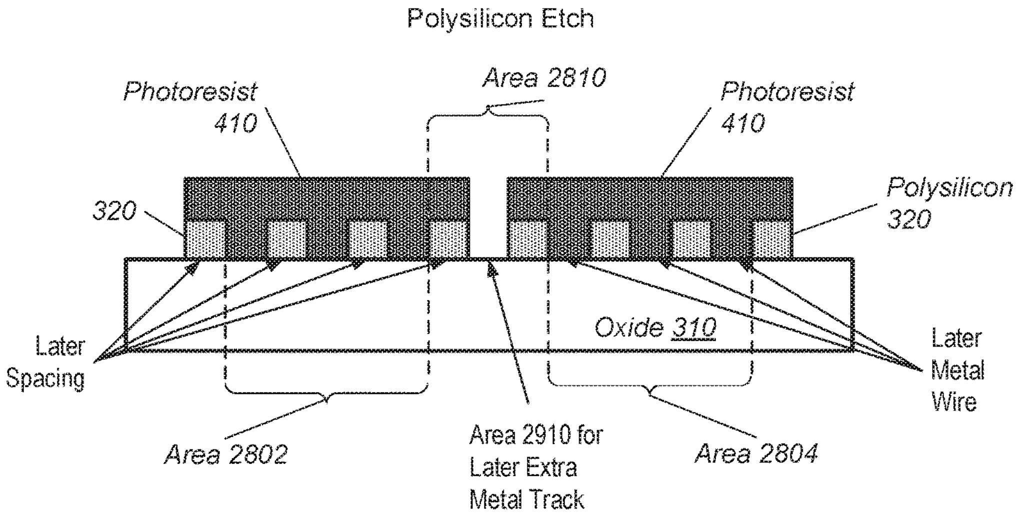
FIG. 29 is a generalized diagram of another cross-sectional view of semiconductor metal patterns being fabricated using alternative steps.

Turning to FIGS. 28-29, generalized block diagrams of other cross-sectional views of semiconductor metal patterns being fabricated are shown. In these diagrams, the fabrication process performs further etching. In FIG. 28, a photoresist layer 410 is formed on top of the polysilicon layer 320. As described earlier and briefly referring again to FIG. 2, the spacing 230 shown in FIG. 2 between the two groups 102 and 104 provides additional signal routing tracks beyond the multiple horizontal tracks used in the groups 102 and 104. In each figure of the previous FIGS. 25-27 and now FIG. 28, the widths of the remaining far left, far right and center polysilicon 320 on the oxide layer 310 determines the spacing between groups of metal patterns.

As highlighted in FIG. 28, the area 2810 is the width of the center polysilicon 320 on the oxide layer 310. The width of the area 2810 determines the width of the later spacing 230 between the groups 102 and 104, and provides area to later form one or more additional metal tracks between the groups 102 and 104. Therefore, to increase the later spacing 230 between the groups 102 and 104, the width of the remaining polysilicon 320 on the oxide layer 310 within the area 2810 is made wider as shown in each figure of the previous FIGS. 25-27 and now FIG. 28.

In the illustrated embodiment shown in FIG. 28, one extra metal track is being placed in the later spacing 230 to be formed. Therefore, within the area 2810, the photoresist 410 is etched until the polysilicon layer 320 is reached. Although etching for a single extra metal track is shown, in other embodiments, another number of etchings is performed in the photoresist layer 410 for another number of extra metal tracks. The width of the etching in the area 2810 is equivalent to the width of the extra metal patterns to be formed later in the area 2810. Additionally highlighted in FIG. 28 is the area 2802, which is between the relatively wide remaining polysilicon layers 320. The area 2802 provides area to later form metal patterns such as the group 102. Similarly, the area 2804 provides area to later form metal patterns such as the group 104.

In FIG. 28, the widths of the other remaining polysilicon 320 on the oxide layer 310 determines the spacing between the metal patterns formed later within the groups 102 and 104. These widths of the other remaining polysilicon 320 accordingly determine the pitch for the metal patterns later formed within the groups 102 and 104. The widths of the photoresist 410 making contact with the oxide layer 310 determines the widths of the later metal patterns to be formed. In FIG. 29, within the area 2810, the polysilicon layer 320 is etched away until the oxide layer 310 is reached. This etching creates area 2910 which provides area for a later extra single metal pattern to be formed.

Figure 30:
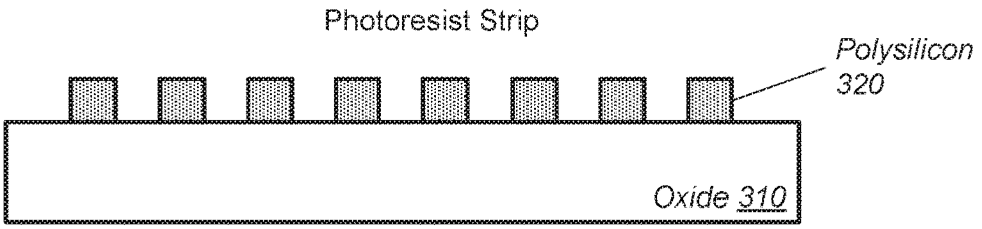
FIG. 30 is a generalized diagram of another cross-sectional view of semiconductor metal patterns being fabricated using alternative steps.
Figure 31:
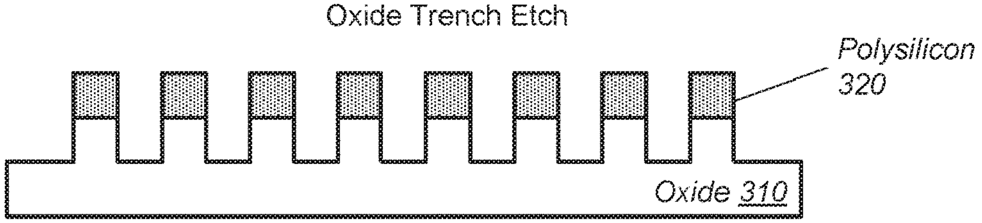
FIG. 31 is a generalized diagram of another cross-sectional view of semiconductor metal patterns being fabricated using alternative steps.
Figure 32:
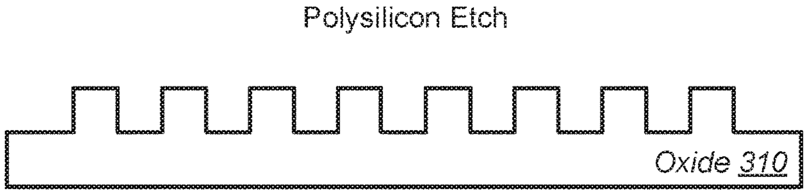
FIG. 32 is a generalized diagram of another cross-sectional view of semiconductor metal patterns being fabricated using alternative steps.
Figure 33:
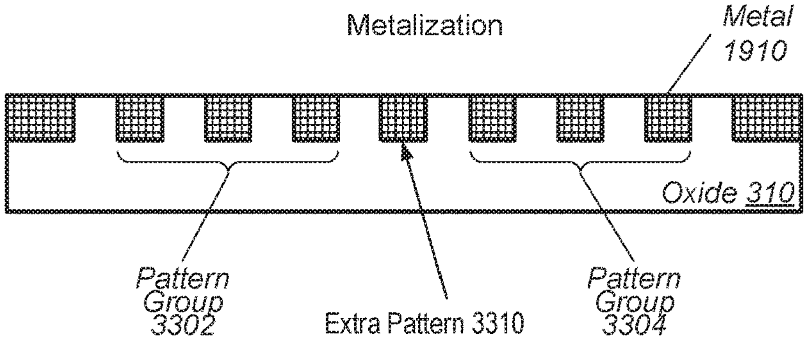
FIG. 33 is a generalized diagram of another cross-sectional view of semiconductor metal patterns being fabricated using alternative steps.

Turning to FIGS. 30-33, generalized block diagrams of other cross-sectional views of semiconductor metal patterns being fabricated are shown. In these diagrams, further etching is performed in addition to metallization. In FIG. 30, the fabrication process strips away the photoresist layer 410. In FIG. 31, the fabrication process etches trenches into areas of the oxide layer 310 which are unprotected by the polysilicon layer 320. In FIG. 32, the polysilicon layer 320 is etched away followed by a metallization step shown in FIG. 33. The metallization step deposits the metal layer 1910 in the etched trenches. As described earlier, in some embodiments, the metal layer 1910 is copper. In other embodiments, the metal layer 1910 is aluminum or a copper and aluminum mix. In other embodiments, cobalt, tungsten, other metals or carbon nanotubes are used.

As shown, each of the pattern groups 3302 and 3304 use three metal patterns for three metal tracks. Although each of the groups 3302 and 3304 is shown to use three metal patterns, in other embodiments, any other number of metal patterns is used. In the illustrated embodiment, an extra metal pattern 3310 is located between the groups 3302 and 3304. The extra pattern 3310 provides an additional signal routing track beyond the groups 3302 and 3304. Although a single extra pattern is shown, any other number of extra patterns placed between the groups 3302 and 3304 is possible and contemplated.

Turning now to FIG. 34, one embodiment of a method 3400 for fabricating metal patterns to be used for metal tracks is shown. A flat and smooth surface contains alternating oxide and nitride regions on top of a polysilicon layer. An oxide layer is below the polysilicon layer. Therefore, the multiple layers contain the oxide layer at the bottom and a polysilicon layer on top of the oxide layer. On top of the polysilicon layer are the alternating regions of polished oxide and nitride regions. In some embodiments, the widths of some of the polished nitride regions are appreciably wider than the widths of other nitride regions and the polished oxide regions. As described earlier regarding the previous FIG. 4 and FIG. 25, the width of the nitride layer 330 is used to define the width of spacing between metal patterns used for metal wires. The larger widths used for the nitride layer 330 are used to define spacing between the metal patterns to be fabricated.

The oxide region of the alternating oxide and nitride regions is etched and removed from the top of the polysilicon layer (block 3402). The exposed portions of the polysilicon layer in the same regions as the previously removed oxide are removed until the oxide layer underneath the polysilicon layer is reached (block 3404). The top alternating nitride regions are removed exposing the alternating polysilicon regions (block 3406).

In some embodiments, one or more extra metal tracks between groups top and bottom metal tracks in the standard cell. However, if no extra metal tracks are being created for the standard cell ("no" branch of the conditional block 3408), then trenches are etched in the oxide layer below the alternating polysilicon regions where the below oxide layer is unprotected by the alternating polysilicon regions (block 3410). Next, the alternating polysilicon regions are removed (block 3412). Afterward, a metallization step deposits metal in the etched trenches (block 3414). In one embodiment, the metal is copper. In another embodiment, the metal is aluminum or a copper and aluminum mix.

If extra metal tracks are being created for the standard cell ("yes" branch of the conditional block 3408), then a photoresist layer is formed on top of the alternating polysilicon regions (block 3416). In regions for the extra metal tracks, each of the photoresist layer and the relatively wide polysilicon region are etched until the oxide layer underneath the polysilicon region is reached (block 3418). The photoresist layer is removed (block 3420). Afterward, control flow of method 3400 moves to block 3410 where trenches are etched followed by the steps in blocks 3412-3414 for completing metallization for the metal tracks.

The processing steps illustrated above in FIGS. 3-22 provide a partial Immersion Lithography solution and cost reduced alternative to full EUV printing of certain limited layers with Sub EUV resolution and enables more cost effective Moore's law scaling at 5 nm and 3 nm technology nodes. Other processing techniques use double pattered EUV with side wall image transfer, but these types of processing techniques use 3 EUV or 2 EUV masks+1 Immersion masks compared to two immersion masks and 1 EUV mask. One EUV mask=3-4 Immersion masks in terms of cost. The invention has 5-6 Immersion mask cost equivalents compared to 9-12 Immersion cost equivalents with the EUV only method. There is also still significant risk with EUV metal mask defect rates. The processing steps described above in FIGS. 3-22 use immersion only for the metal mask and EUV for the CUT mask which is significantly lower risk and in practice today. Using the processing steps described above in FIGS. 3-22, standard cells rout efficiently if they have triplet path groupings for each n-ch and p-ch device or 6 total tracks to route the gate and source/drain connections. Over scaling these tracks using the above processing steps mask that possible with less cost compared to EUV and reduces or eliminated added area bloat through CPP slips or added area to complete complex cells. This ultimately will reduce area and power at 5 nm and 3 nm.

A novel Immersion Lithography process is described as an alternative to EUV that can achieve sub EUV patterning capability. Sub EUV patterning is possible but will be very expensive compared to the approach in this disclosure. EUV mask blank defectivity is still very high and makes metal layer masks difficult to print defect free compared to contact, via and cut masks. Ultimately the mask blank defectivity will be solved but it is a question of when and schedule. The primary motivation is cost reduction for sub EUV metal mask patterning. Secondary is potential pattern flexibility and better line width roughness control and reduced variability.

It is noted that one or more of the above-described embodiments include software. In such embodiments, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various embodiments, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A semiconductor device fabrication process comprising:

forming a first nitride layer on top of a first polysilicon layer which is on top of a first oxide layer;

depositing a second polysilicon layer on top of the first nitride layer;

depositing a photoresist layer on top of the second polysilicon layer;

etching photoresist trenches in the photoresist layer until the second polysilicon layer is reached, wherein at least one photoresist trench has a width used for a group of metal patterns to be formed;

etching each of the second polysilicon layer and the first nitride layer in the photoresist trenches until the first polysilicon layer is reached which creates a first plurality of mandrels comprising remaining photoresist, remaining second polysilicon and remaining first nitride;

removing the remaining photoresist from the first plurality of mandrels;

depositing a conformal spacer oxide layer over the first plurality of mandrels and exposed areas of the first polysilicon layer;

etching the conformal spacer oxide layer leaving sidewalls on each of the first plurality of mandrels;

depositing a conformal spacer nitride layer over the first plurality of mandrels and exposed areas of the first polysilicon layer;

etching the conformal spacer nitride layer leaving sidewalls on the first plurality of mandrels to form a double spacer comprising remaining spacer nitride and remaining spacer oxide depositing a second oxide layer over the double spacers and exposed areas of the first polysilicon layer;

removing portions of the second oxide layer and the double spacer until the remaining first nitride in the first plurality of mandrels are reached, wherein the second polysilicon in the first plurality of mandrels is completely removed, wherein on top of the first polysilicon layer are alternating regions comprising the remaining spacer nitride, the remaining spacer oxide, the remaining first nitride, and remaining second oxide;

removing each of the remaining spacer oxide and the remaining second oxide from the alternating regions on top of the first polysilicon layer; and etching the first polysilicon layer in areas unprotected by the remaining spacer nitride and the remaining first nitride of the alternating regions until the first oxide layer is reached, which creates a second plurality of mandrels comprising the remaining spacer nitride with remaining first polysilicon underneath or the remaining first nitride with remaining first polysilicon underneath.

2. The semiconductor device fabrication process as recited in claim 1, wherein at least one mandrel of the first plurality of mandrels has a width for spacing between two groups of metal patterns to be formed.

3. The semiconductor device fabrication process as recited in claim 1, wherein the remaining spacer nitride in the double spacer has a width used for spacing between metal patterns of the group of metal patterns to be formed.

4. The semiconductor device fabrication process as recited in claim 1, wherein the remaining spacer oxide in the double spacer has a width used for a width of metal patterns of the group of metal patterns to be formed.

5. The semiconductor device fabrication process as recited in claim 1, wherein the process further comprises:

remove each of the remaining spacer nitride and the remaining first nitride from the second plurality of mandrels;

etch oxide trenches in the first oxide layer in areas where the first oxide layer is unprotected by the second plurality of mandrels.

6. The semiconductor device fabrication process as recited in claim 5, wherein the process further comprises:

remove the remaining first polysilicon from the second plurality of mandrels; and deposit metal in the oxide trenches.

7. The semiconductor device fabrication process as recited in claim 1, wherein the process further comprises:

etch oxide trenches in the first oxide layer in areas where the first oxide layer is unprotected by the second plurality of mandrels; and remove each of the remaining spacer nitride and the remaining first nitride from the second plurality of mandrels.

8. A non-transitory computer readable storage medium storing program instructions, wherein the program instructions for performing a semiconductor fabrication process are executable by a processor to:

form a first nitride layer on top of a first polysilicon layer which is on top of a first oxide layer;

deposit a second polysilicon layer on top of the first nitride layer;

deposit a photoresist layer on top of the second polysilicon layer;

etch photoresist trenches in the photoresist layer until the second polysilicon layer is reached, wherein at least one photoresist trench has a width used for a group of metal patterns to be formed;

etch each of the second polysilicon layer and the first nitride layer in the photoresist trenches until the first polysilicon layer is reached which creates a first plurality of mandrels comprising remaining photoresist, remaining second polysilicon and remaining first nitride;

remove the remaining photoresist from the first plurality of mandrels;

deposit a conformal spacer oxide layer over the first plurality of mandrels and exposed areas of the first polysilicon layer;

etch the conformal spacer oxide layer leaving sidewalls on each of the first plurality of mandrels;

deposit a conformal spacer nitride layer over the first plurality of mandrels and exposed areas of the first polysilicon layer;

etch the conformal spacer nitride layer leaving sidewalls on the first plurality of mandrels to form a double spacer comprising remaining spacer nitride and remaining spacer oxide;

deposit a second oxide layer over the double spacers and exposed areas of the first polysilicon layer;

remove portions of the second oxide layer and the double spacer until the remaining first nitride in the first plurality of mandrels are reached, wherein the second polysilicon in the first plurality of mandrels is completely removed, wherein on top of the first polysilicon layer are alternating regions comprising the remaining spacer nitride, the remaining spacer oxide, the remaining first nitride, and remaining second oxide;

remove each of the remaining spacer oxide and the remaining second oxide from the alternating regions on top of the first polysilicon layer; and etch the first polysilicon layer in areas unprotected by the remaining spacer nitride and the remaining first nitride of the alternating regions until the first oxide layer is reached, which creates a second plurality of mandrels comprising the remaining spacer nitride with remaining first polysilicon underneath or the remaining first nitride with remaining first polysilicon underneath.

9. The non-transitory computer readable storage medium as recited in claim 8, wherein at least one mandrel of the first plurality of mandrels has a width for spacing between two groups of metal patterns to be formed.

10. The non-transitory computer readable storage medium as recited in claim 8, wherein the program instructions are further executable by a processor to:

remove each of the remaining spacer nitride and the remaining first nitride from the second plurality of mandrels.

11. The non-transitory computer readable storage medium as recited in claim 10, wherein the program instructions are further executable by a processor to:

form a photoresist layer on top of the remaining polysilicon of the second plurality of mandrels;

etch through each of the photoresist layer and the remaining polysilicon in areas for extra metal tracks; and remove the remaining photoresist.

12. The non-transitory computer readable storage medium as recited in claim 11, wherein the program instructions are further executable by a processor to:

etch oxide trenches in the first oxide layer in areas where the first oxide layer is unprotected by the second plurality of mandrels;

remove the remaining first polysilicon from the second plurality of mandrels; and deposit metal in the oxide trenches.

* * * * *

UNITED STATES PATENT AND TRADEMARK OFFICE
CERTIFICATE OF CORRECTION

PATENT NO. : 10,304,728 B2  
APPLICATION NO. : 15/608749  
DATED : May 28, 2019  
INVENTOR(S) : Richard T. Schultz Page 1 of 1

It is certified that error appears in the above-identified patent and that said Letters Patent is hereby corrected as shown below:

On the Title Page

Item (72) Inventor:
Lines 1-2, please delete "Fort Collins, OH (US)" and substitute -- Fort Collins, CO (US) --.

Signed and Sealed this
Eighth Day of October, 2019

Andrei Iancu
*Director of the United States Patent and Trademark Office*